United States Patent
Mugibayashi et al.

(10) Patent No.: US 6,473,665 B2
(45) Date of Patent: Oct. 29, 2002

(54) DEFECT ANALYSIS METHOD AND PROCESS CONTROL METHOD

(75) Inventors: Toshiaki Mugibayashi, Tokyo (JP); Nobuyoshi Hattori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/920,818

(22) Filed: Aug. 3, 2001

(65) Prior Publication Data

US 2002/0002415 A1 Jan. 3, 2002

Related U.S. Application Data

(63) Continuation of application No. 09/206,150, filed on Dec. 7, 1998, which is a continuation-in-part of application No. 09/089,356, filed on Jun. 3, 1998, now abandoned.

(30) Foreign Application Priority Data

Jan. 14, 1998 (JP) .......................................... 10-005731
Sep. 2, 1998 (JP) .......................................... 10-248156

(51) Int. Cl.$^7$ .............................................. G06F 19/00
(52) U.S. Cl. ........................ 700/110; 700/121; 700/103; 714/25; 324/765
(58) Field of Search ................................ 700/110, 121, 700/103; 712/83, 35, 81, 84; 716/4

(56) References Cited

U.S. PATENT DOCUMENTS

| | | | | |
|---|---|---|---|---|
| 5,665,609 A | * | 9/1997 | Mori | 324/765 |
| 5,761,064 A | * | 6/1998 | La et al. | 700/110 |
| 5,801,965 A | * | 9/1998 | Takagi et al. | 700/110 |
| 5,946,213 A | * | 8/1999 | Steffan et al. | 700/110 |
| 5,991,699 A | * | 11/1999 | Kulkarni et al. | 700/110 |
| 5,999,003 A | * | 12/1999 | Steffan et al. | 700/110 |
| 6,035,244 A | * | 3/2000 | Chen et al. | 700/110 |
| 6,341,241 B1 | * | 1/2002 | Mugibayashi et al. | 700/103 |

OTHER PUBLICATIONS

Stacy Hall et al., "Yield Monitoring and Analysis in Semiconductor Manufacturing", SEMICON Kansai ULSI Technology Seminar (Hyatt Regency Osaka), May 29, 1997, pp. 4–42–4–47.

* cited by examiner

Primary Examiner—James P. Trammell
Assistant Examiner—Firmin Backer
(74) Attorney, Agent, or Firm—Oblon, Spivak, McClelland, Maier & Neustadt, P.C.

(57) ABSTRACT

A defect analysis method makes it possible to quantitative grasp the influence of the number of new defects of a single process on the yield of a device. After the presence or absence of a new defect due to a specified process in each chip is judged, and defectiveness or non-defectiveness of the chip is judged by an electric tester, a plurality of chips on a wafer are classified into four groups: ① non-defective chip with no new defect; ② defective chip with no new defect; ③ non-defective chip with new defect; and ④ defective chip with new defect, to obtained the number of new defective chips considered to be caused only by the new defect of the specified process; a critical ratio of the new defect of the specified process, at which a chip is considered to become defective; and the number of process defective chips considered to be caused by the specified process.

9 Claims, 17 Drawing Sheets

- NEW DEFECTS OF PROCESS D = 52 DEFECTS DISTRIBUTED AMONG 45 CHIPS
- ▦ DEFECTIVE CHIP = 45 CHIPS
- ☐ NON-DEFECTIVE CHIP = 57 CHIPS

- 1 μm OR MORE NEW DEFECT OF PROCESS D
  = 34 DEFECTS DISTRIBUTED AMONG 30 CHIPS
- ▩ DEFECTIVE CHIP = 78 CHIPS
- ☐ NON-DEFECTIVE CHIP = 57 CHIPS

①NON-DEFECTIVE CHIP WITH NO NEW DEFECT

③NON-DEFECTIVE CHIP WITH 1 μm OR MORE NEW DEFECT

②DEFECTIVE CHIP WITH NO NEW DEFECT

④DEFECTIVE CHIP WITH 1 μm OR MORE NEW DEFECT

FIG. 14

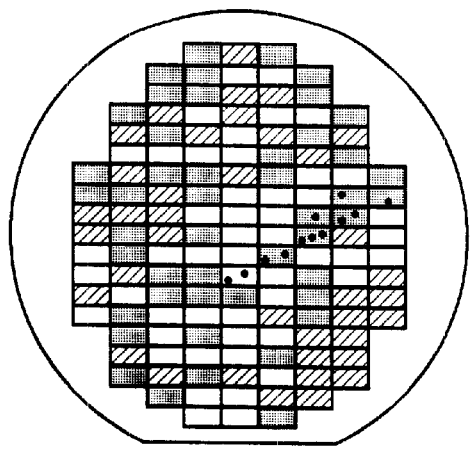

- NEW DEFECT OF PROCESS D HAVING SPECIFIC DISTRIBUTION
  =12 DEFECTS DISTRIBUTED AMONG 7 CHIPS

▨ , ▦ DEFECTIVE CHIP
☐ NON-DEFECTIVE CHIP

FIG. 15

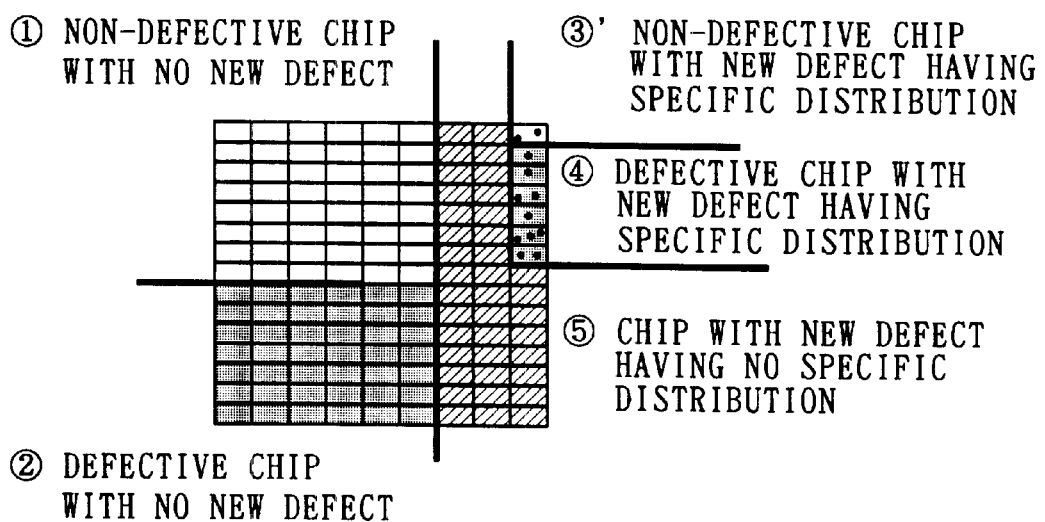

① NON-DEFECTIVE CHIP WITH NO NEW DEFECT
② DEFECTIVE CHIP WITH NO NEW DEFECT
③' NON-DEFECTIVE CHIP WITH NEW DEFECT HAVING SPECIFIC DISTRIBUTION
④ DEFECTIVE CHIP WITH NEW DEFECT HAVING SPECIFIC DISTRIBUTION
⑤ CHIP WITH NEW DEFECT HAVING NO SPECIFIC DISTRIBUTION

① NON-DEFECTIVE CHIP WITH NO NEW DEFECT (48)
② DEFECTIVE CHIP WITH NO NEW DEFECT (42)
③ NON-DEFECTIVE CHIP WITH NEW DEFECT OF LESS THAN 1 μm (5)
④ DEFECTIVE CHIP WITH NEW DEFECT OF LESS THAN 1 μm (10)
⑤ CHIP WITH NEW DEFECT OF 1 μm OR MORE (30)

DEFECT ANALYSIS METHOD AND PROCESS CONTROL METHOD

This application is a con of 09/206,150 Dec. 7, 1998 which is CIP of 09/089,356 Jun. 3, 1998 abandoned.

BACKGROUND OF THE INVENTION

1. Field of the Invention

The present invention relates to a defect analysis method for analyzing the cause of defectiveness in electric characteristics or the like of a semiconductor device which is capable of inspecting the presence or absence of defects in a product during the manufacturing process.

2. Background of the Invention

Conventionally, a semiconductor device such as a DRAM or a micro computer has been manufactured through a plurality of manufacturing processes. After those processes have been completed, a total defective/non-defective test on the electric characteristics has been carried out to obtain an yield of the device. On the other hand, after a specified process out of the plurality of manufacturing processes, inspection by an inspection apparatus has been carried out to detect a defect.

Now, we will describe several types of defects to be detected by the inspection apparatus. The defects include a pattern defect, a particle, adhesion of contaminants (stains), damage, or the like. The pattern defect includes short (two wires or layers to be generally isolated are short-circuited), breaking of wire (wires or layers to be generally connected are disconnected), abnormality in shape (the shape of a pattern is abnormal), or the like. A probable cause of the short or the breaking of wire is, for example, patterning with a particle used as a mask. The particle is considered to include an adhered particle, etching residual, or the like. An example of the adhesion of contaminants is adhesion of contaminants in a wet tub. The damage can occur, for example, when a handling error makes a scratch on a wafer.

In defect analysis, the influence of a specified process on the yield of the semiconductor device can be inspected by comparing the yield of the semiconductor device obtained after the manufacturing processes and the number of defects detected after the specified process.

The number of defects detected at the specified process is, however, highly unstable because it can be increased when an unusual number of defects or an aggregate defect is included in a single chip, or because it can be unreliable when the defects detected after the specified process includes a large number of defects due to previous processes. Thus, only a low-reliable correlation is available from a simple comparison between the number of defects detected at the specified process and the yield of the device. This creates a great difficulty in improving accuracy in analyzing the influence of the specified process on the yield of the device.

SUMMARY OF THE INVENTION

A first aspect of the present invention is directed to a defect analysis method of a device which includes an integrated circuit formed through a plurality of processes on each of a plurality of chips on a wafer. The defect analysis method comprises the steps of: (a) after each of at least one process out of the plurality of processes, detecting a new defect caused by at least one process and occurring in a new area of the wafer other than an area of a defect occurring at a previous process and its vicinity; (b) after the plurality of processes are completed, making a defective/non-defective judgment on the integrated circuit on each of the plurality of chips is; (c) judging the presence or absence of the new defect satisfying a predetermined identifying condition, for each of the plurality of chips for each of at least one process; (d) classifying the plurality of chips into four groups on the basis of a combination of the judgment of the step (b) and the judgment of the step (c), for each of at least one process; and (e) calculating the number of new defective chips considered to be caused only by the new defect of at least one process, on the basis of the fourfold classification of the step (d).

According to a second aspect of the present invention, the defect analysis method further comprises the step of: (f) calculating a critical rate of the new defect of at least one process, at which a chip is considered to become defective, on the basis of the fourfold classification of the step (d).

According to a third aspect of the present invention, the defect analysis method further comprises the step of: (g) calculating the number of process defective chips considered to be caused by at least one process, on the basis of the fourfold classification of the step (d) and the critical rate.

According to a fourth aspect of the present invention, in the defect analysis method, the step (c) is performed a plurality of times by using each of a plurality of detection sizes as a referred detection size, wherein the predetermined identifying condition includes a condition that a defect be of not less than the referred detection size; and the steps (d) to (g) are performed the plurality of times corresponding to the step (c) performed the plurality of times, so that data for analysis consisting of the number of new defective chips, the critical rate, and the number of process defective chips are obtained for each of the plurality of detection sizes for each of at least one process.

According to a fifth aspect of the present invention, the defect analysis method further comprises the step of: (h) after the steps (c) to (g) are performed the plurality of times, recognizing at least one of the following as an analysis result of at least one process on the basis of the data for analysis: an absolute critical detection size which is the minimum detection size for 100% of the critical rate out of the plurality of detection sizes; the maximum number of process defective chips out of the numbers of process defective chips obtained for each of the plurality of detection sizes; an optimum-sensitivity detection size corresponding to the maximum number of process defective chips, out of the plurality of detection sizes; and the number of optimum-sensitivity new defective chips corresponding to the optimum-sensitivity detection size out of the numbers of new defective chips obtained for each of the plurality of detection sizes.

According to a sixth aspect of the present invention, in the defect analysis method, at least one process includes a predetermined number of processes of not less than two; the data for analysis is obtained for each of the predetermined number of processes, and at the step (h), the maximum number of process defective chips is recognized for each of the predetermined number of processes. The defect analysis method further comprises the step of: (i) ranking the predetermined number of processes according to their necessity for improvement, by comparing the maximum numbers of process defective chips of the predetermined number of processes.

According to a seventh aspect of the present invention, in the defect analysis method, at least one process includes the plurality of processes; the data for analysis is obtained for each of the plurality of processes; and the step (h) includes a step of recognizing the number of optimum-sensitivity new defective chips for each of the plurality of processes. The defect analysis method further comprises the step of: (i) recognizing a degree to which the cause of defectiveness is detected, by comparing a total number of the numbers of optimum-sensitivity new defective chips of the plurality of processes, and the number of chips judged as defective at the step (b).

According to an eighth aspect of the present invention, in the defect analysis method, the device includes a plurality of devices of the same structure each manufactured through the plurality of processes of a plurality of manufacturing lines; the steps (b) to (h) are performed for each of the plurality of devices; and the step (h) includes a step of recognizing the maximum number of process defective chips of at least one process of each of the plurality of manufacturing lines. The defect analysis method further comprises the step of: (i) recognizing superiority or inferiority of the plurality of manufacturing lines by comparing the maximum numbers of process defective chips of at least one process of the plurality of manufacturing lines.

According to a ninth aspect of the present invention, in the defect analysis method, at least one process includes a predetermined number of processes of not less than two which are the same in contents but different inspection apparatus to be used for inspection at the step (a); the data for analysis is obtained for each of the predetermined number of processes; and the critical rate includes the predetermined number of critical rates of the same detection level corresponding to the predetermined number of processes. The defect analysis method further comprises the step of: (h) recognizing a difference in sensitivity between the predetermined number of inspection apparatuses by comparing the predetermined number of critical rates of the same detection level.

According to a tenth aspect of the present invention, in the defect analysis method, the predetermined identifying condition of the step (c) includes a condition that the new defect be in a specific area of the wafer.

According to an eleventh aspect of the present invention, in the defect analysis method, the step (b) includes a step of judging whether each of the plurality of chips is defective or non-defective on the basis of a specific electrical characteristic.

According to a twelfth aspect of the present invention, in the defect analysis method, the predetermined identifying condition of the step (c) includes a condition that a defect be re-detected at the same plane position as the new defect, at a predetermined process after at least one process.

According to a thirteenth aspect of the present invention, in the defect analysis method, the wafer includes a plurality of wafers, and the plurality of chips includes every chip formed on the plurality of wafers.

According to a fourteenth aspect of the present invention, in the defect analysis method, the predetermined identifying condition of the step (c) limits the number of new defects in a single chip.

A fifteenth aspect of the present invention is directed to a storage medium for storing a defect analysis program for having a defect analysis system with a computer execute a defect analysis processing of a device which includes an integrated circuit formed through a plurality of processes on each of a plurality of chips on a wafer. The defect analysis system comprises: at least one inspection apparatus for detecting a position of coordinates of a defect on the wafer and the size of the defect, after each of the plurality of processes, to output defect information; a tester for judging whether each of the integrated circuit on the plurality of chips on the wafer is defective or non-defective after the plurality of processes are completed, to output defective/non-defective judgment information; and a control portion for executing the defect analysis program upon receipt of the defect information and the defective/non-defective judgment information. Further, the storage medium stores the defect analysis program for having the computer execute the steps of: (a) after each of at least one process out of the plurality of processes, detecting a new defect caused by at least one process and occurring in a new area of the wafer other than an area of a defect occurring at a previous step and its vicinity, on the basis of the defect information; (b) after the plurality of processes are completed, making a defective/non-defective judgment on the integrated circuit on each of the plurality of chips on the basis of the defective/non-defective judgment information; (c) judging the presence or absence of the new defect satisfying a predetermined identifying condition, for each of the plurality of chips for each of at least one process; (d) classifying the plurality of chips into four groups on the basis of a combination of the judgment of the step (b) and the judgment of the step (c), for each of at least one process; and (e) calculating the number of new defective chips considered to be caused only by the new defect of at least one process, on the basis of the fourfold classification of the step (d).

A sixteenth aspect of the present invention is directed to a storage medium for storing a defect analysis program for having a defect analysis system with a computer execute a defect analysis processing of a device which includes an integrated circuit formed through a plurality of processes on each of a plurality of chips on a wafer. The defect analysis system comprises: at least one inspection apparatus for detecting a position of coordinates of a defect on the wafer and the size of the defect, after each of the plurality of processes, to output defect information; a tester for making a defective/non-defective judgment on the integrated circuit on each of the plurality of chips on the wafer after the plurality of processes are completed, to output defective/non-defective judgment information; and a control portion for executing the defect analysis program upon receipt of the defect information and the defective/non-defective judgment information, wherein the control portion or at least one inspection apparatus has a function to, after each of at least one process out of the plurality of processes, detect a new defect caused by at least one process and occurring in a new area of the wafer other than an area of a defect occurring at a previous process and its vicinity, on the basis of the defect information. The storage medium stores the defect analysis program for having the computer execute the steps of: (a) receiving a new defect caused by at least one process; (b) after the plurality of processes are completed, making a defective/non-defective judgment on the integrated circuit on each of the plurality of chips, on the basis of the defective/non-defective judgment information; (c) judging the presence or absence of the new defect satisfying a predetermined identifying condition, for each of the plurality of chips for each of at least one process; (d) classifying the plurality of chips into four groups on the basis of a combination of the judgment of the step (b) and the judgment of the step (C), for each of at least one process; and (e) calculating the number of new defective chips considered to be caused only by the new defect of at least one process, on the basis of the fourfold classification of the step (d).

According to a seventeenth aspect of the present invention, in the storage medium, the defect analysis program has the computer further execute the step of: (f) calculating a critical rate of the new defect of at least one process, at which a chip is considered to become defective, on the basis of the fourfold classification of the step (d).

According to an eighteenth aspect of the present invention, in the storage medium, the defect analysis program has the computer further execute the step of: (g) calculating the number of process defective chips considered to be caused by at least one process, on the basis of the fourfold classification of the step (d) and the critical rate.

A nineteenth aspect of the present invention is directed to a process control method for performing an analysis of a device which includes an integrated circuit formed on each of a plurality of chips on a wafer through a plurality of processes, and then estimating an yield in manufacturing a new integrated circuit on each of a plurality of chips on a new wafer through a plurality of new processes which are identical to the plurality of processes. The process control method comprises the steps of: (a) after each of the plurality of processes, detecting a new defect due to each of the plurality of processes occurring in a new area on the wafer other than an area of a defect occurring at a previous process and its vicinity; (b) after the plurality of processes are completed, making a defective/non-defective judgement on the integrated circuit on each of the plurality of chips; (c) judging the presence or absence of a new defect satisfying a predetermined identifying condition in each of the plurality of chips, for each of the plurality of processes; (d) classifying the plurality of chips into four groups on the basis of a combination of the judgement of the step (b) and the judgement of the step (c), for each of the plurality of processes; and (e) calculating a critical rate of the new defect of each of the plurality of processes, at which a chip is considered to be defective, on the basis of the fourfold classification of the step (d). The analysis includes the steps (a) to (e). The process control method further comprises the step of: (f) calculating an estimated yield of each target process consisting of the plurality of new processes through similar steps to the steps (a) and (c), on the basis of the number of newly detected new defects satisfying the predetermined identifying condition and a critical rate of the target process which is obtained through the analysis of the plurality of processes.

According to a twentieth aspect of the present invention, the process control method of the nineteenth aspect further comprises the step of: (g) after the step (f), calculating a total estimated yield of the plurality of new processes on the basis of the estimated yield of each of the plurality of new processes.

According to a twenty-first aspect of the present invention, in the process control method of the nineteenth aspect, the predetermined identifying condition includes a classification condition that defines a plurality of kinds to classify the new defect. The step (c) includes a step of judging the presence or absence of the new defect of each of the plurality of kinds defined by the classification condition; the step (d) includes a step of classifying the plurality of chips into four groups for each of the plurality of kinds; the number of newly detected new defects includes a plurality of numbers of newly detected new defects corresponding to the plurality of kinds, respectively; the critical rate includes a plurality of critical rates corresponding to the plurality of kinds, respectively; and the step (f) includes a step of calculating an estimated yield of each of the plurality of new processes on the basis of the plurality of numbers of newly detected new defects and the plurality of critical rates.

According to a twenty-second aspect of the present invention, in the process control method of the twenty-first aspect, the plurality of kinds include kinds classified on the basis of a detection size of the new defect.

According to a twenty-third aspect of the present invention, in the process control method of the twenty-first aspect, the plurality of kinds include kinds classified on the basis of the number of the new defects in a single chip.

According to a twenty-fourth aspect of the present invention, in the process control method of the twenty-first aspect, the plurality of kinds include kinds classified on the basis of the presence or absence of the new defect in at least one specific area of the wafer.

According to a twenty-fifth aspect of the present invention, in the process control method of the twenty-first aspect, the plurality of kinds include kinds classified on the basis of the shape of the new defect.

According to a twenty-sixth aspect of the present invention, in the process control method of the twenty-first aspect, the plurality of kinds include kinds classified on the basis of a combination of at least two of the following: a detection size of the new defect; the number of the new defects in a single chip; the presence or absence of the new defect in at least one specific area of the wafer; and the shape of the new defect.

According to a twenty-seventh aspect of the present invention, in the process control method of the nineteenth aspect, the wafer includes a plurality of wafers; and the plurality of chips are formed on the plurality of wafers.

According to a twenty-eighth aspect of the present invention, in the process control method of the nineteenth aspect, the predetermined identifying condition includes a new-defect judgement condition that a new defect out of the new defect which is detected but judged as having no influence on yield should not be regarded as the new defect.

According to a twenty-ninth aspect of the present invention, the process control method of the twentieth aspect further comprises the step of: (h) after the step (g), correcting a total estimated yield of the plurality of new processes to a correction value that is obtained through an analysis of a total estimated yield of a plurality of past processes and an actual yield.

According to a thirtieth aspect of the present invention, in the process control method of the nineteenth aspect, the process (f) includes a step of calculating a middle estimated yield of a predetermined number of processes out of the plurality of new processes, on the basis of an estimated yield of each of the predetermined number of processes.

In the defect analysis method according to the first aspect of the present invention, a plurality of chips are classified into four groups (classification of new defects) on the basis of a combination of the judgment of the step (b) and the judgment of the step (c) about the defectiveness or non-defectiveness of a chip and the presence or absence of a new defect meeting a predetermined identifying condition, respectively. According to the classification, the number of new defective chips considered to be caused only by the new defect of at least one process is calculated.

This makes it possible to quantitatively recognize an increasable number of non-defective chips when at least one process is perfectly improved.

At the step (f) of the defect analysis method of the second aspect, the critical rate of the new defect of at least one process, at which a chip is considered to become defective, is calculated on the basis of the classification of new defects. This makes it possible to quantitatively recognize the sensitivity of an inspection apparatus to detect a defect.

At the step (g) of the defect analysis method of the third aspect, the number of process defective chips considered to be caused by at least one process is calculated on the basis of the classification of new defects and the critical rate. This makes it possible to quantitatively recognize the influence of at least one process on the yield of the device.

In the defect analysis method of the fourth aspect, the steps (c) to (g) are performed for each of a plurality of detection sizes as a referred detection size, to obtain data for analysis including the number of new defective chips, the critical rate, and the number of process defective chips, for each of the plurality of detection sizes for at least one process.

Analysis of the data for analysis makes it possible to compare and examine the number of new defective chips, the critical rate, and the number of process defective chips for each of the plurality of detection sizes.

Further, at the step (h) of the defect analysis method of the fifth aspect, on the basis of the data for analysis, at least one of the following is recognized as an analysis result of at least one process: the absolute critical detection size which is the minimum detection size for 100% of the critical rate out of the plurality of detection sizes; the maximum number of process defective chips out of the numbers of process defective chips for the plurality of detection sizes; an optimum-sensitivity detection size corresponding to the maximum number of process defective chips, out of the plurality of detection sizes; and the number of optimum-sensitivity new defective chips corresponding to the optimum-sensitivity detection size, out of the numbers of new defective chips for the plurality of detection sizes.

This brings about at least one of the following effects: a first effect that the size of the defect which always causes yield deterioration can be recognized from the absolute critical detection size; a second effect that the influence of at least one process on the yield of the device can be accurately recognized from the maximum number of process defective chips; a third effect that an optimum detection size for defect analysis can be recognized from the optimum-sensitivity defection size; and a fourth effect that an increasable number of non-defective chips when at least one process is perfectly improved can be obtained from the number of optimum-sensitivity new defective chips.

At the step (i) of the defect analysis method of the sixth aspect, the predetermined number of processes can be accurately ranked according to their necessity for improvement by comparing the maximum numbers of process defective chips of the predetermined number of processes, irrespective of a difference in the sensitivity to detect a new defect between the predetermined number of processes.

At the step (i) of the defect analysis method of the seventh aspect, a degree to which the cause of defectiveness is detected can be quantitatively recognized for each of the plurality of processes by comparing a total of the numbers of optimum-sensitivity new defective chips of the plurality of processes, and the number of chips judged as defective at the step (b), irrespective of a difference in the sensitivity to detect a new defect between the plurality of processes.

Further, at the step (i) of the defect analysis method of the eighth aspect, superiority or inferiority of at least one process of the plurality of manufacturing lines can be quantitatively recognized by comparing the maximum numbers of process defective chips of at least one process of the plurality of manufacturing lines, irrespective of a difference in the sensitivity to detect a new defect of at least one process between the plurality of manufacturing lines.

At the step (h) of the defect analysis method of the ninth aspect, a difference in sensitivity between the predetermined number of inspection apparatuses can be simply recognized, without any complicate processing, by comparing the predetermined number of critical rates of the same detection level.

In the defect analysis method of the tenth aspect, since the predetermined identifying condition includes a condition that a new defect be in a specific area of a wafer, a correlation between the new defect in the specific area and the yield of the device can be quantitatively recognized.

The step (b) of the defect analysis method of the eleventh aspect includes a step of making a defective/non-defective judgment on each of the plurality of chips on the basis of a specific electrical characteristic. Thus, a correlation between the new defect and the yield of the device can be quantitatively recognized, focusing on the specific electrical characteristic.

In the defect analysis of the twelfth aspect, the predetermined identifying condition includes a condition that a defect be re-detected at a predetermined process after at least one process, at the same plane position as the new defect. Thus, a correlation between the new defect and the yield of the device can be quantitatively recognized in consideration of the degree of the growth of the new defect.

In the defect analysis method of the thirteenth aspect, a wafer includes a plurality of wafers, and a plurality of chips include every chip formed on the plurality of wafers. This increases the number of chips to be analyzed as compared to a case using only a single wafer, thereby increasing statistic reliability of the defect analysis.

In the defect analysis method of the fourteenth aspect, the predetermined identifying condition limits the number of new defects in a single chip. Thus, a correlation between the new defect and the yield of the device can be quantitatively recognized in consideration of the number of new defects.

According to the defect analysis program stored in the storage medium of the fifteenth aspect of the present invention, a plurality of chips are classified (classification of new defects) on the basis of a combination of the judgment of the step (b) and the judgment of the step (c) about defectiveness or non-defectiveness of a chip and the presence or absence of a new defect satisfying a predetermined identifying condition. According to the classification of new defects, the number of new defective chips considered to be caused only by the new defect of at least one process is calculated.

This makes it possible to quantitatively recognize an increasable number of non-defective chips when at least one process is perfectly improved.

According to the defect analysis program stored in the storage medium of the sixteenth aspect, as in the fifteenth aspect, the number of new defective chips considered to be caused only by the new defect of at least one process is calculated on the basis of the classification of new defects.

This makes it possible to quantitatively recognize an increasable number of non-defective chips when at least one process is perfectly improved.

At the step (f) of the defect analysis program stored in the storage medium of the seventeenth aspect, the critical ratio of the new defect of at least one process, at which a chip is considered to become defective, is calculated on the basis of the classification of new defects. This makes it possible to quantitatively recognize the sensitivity of an inspection apparatus to detect a defect.

At the step (g) of the defect analysis program stored in the storage medium of the eighteenth aspect, the number of process defective chips considered to be caused by at least one process is calculated on the basis of the classification of new defects and the critical ratio. This makes it possible to quantitatively recognize the influence of at least one process on the yield of the device.

At the step (f) of the process control method of the nineteenth aspect, an estimated yield of each target process consisting of a plurality of new processes is calculated from the number of newly detected new defects satisfying a predetermined identifying condition and a critical rate of the target process that is obtained through an analysis of a plurality of past processes. This increases accuracy of the estimated yield of each target process.

At the step (g) of the process control method of the twentieth aspect, after the step (f), a total estimated yield of a plurality of new processes is calculated from an estimated yield of each of the plurality of new processes. This increases accuracy of the total estimated yield of the plurality of new processes.

In the process control method of the twenty-first aspect, the predetermined identifying condition includes a classification condition that defines a plurality of kinds to classify new defects. The step (c) includes a step of judging the presence or absence of the new defect of each of the plurality of kinds defined by the classification condition; the step (d) includes a step of classifying the plurality of chips into four groups for each of the plurality of kinds; the number of newly detected new defects includes a plurality of numbers of newly detected new defects corresponding to the plurality of kinds respectively; the critical rate includes a plurality of critical rates corresponding to the plurality of kinds, respectively; and the step (f) includes a step of calculating an estimated yield of each target process out of the plurality of new processes on the basis of the plurality of numbers of newly detected new defects and the plurality of critical rates.

That is, for analysis, the plurality of numbers of newly detected new defects and the plurality of critical rates are first obtained corresponding to the plurality of kinds, for each of a plurality of processes. Then, an estimated yield of each target process out of the plurality of new processes are calculated from the plurality of critical rates obtained for each of a plurality of new processes. This increases accuracy of the estimated yield of each target process.

In the process control method of the twenty-second aspect, a plurality of kinds include kinds classified on the basis of a detection size of the new defect. This increases accuracy in yield estimation even when a particle size distribution of defects over the wafer during analysis is different from that during estimation.

In the process control method of the twenty-third aspect, a plurality of kinds include kinds classified on the basis of the number of new defects in a single chip. This increases accuracy in yield estimation even when an aggregate distribution of defects over the wafer during analysis is different from that during estimation.

In the process control method of the twenty-fourth aspect, a plurality of kinds include kinds classified on the basis of the presence or absence of the new defect in at least one specific area of the wafer. This increases accuracy in yield estimation even when a specific distribution of defects over the wafer during analysis is different from that during estimation.

In the process control method of the twenty-fifth aspect, a plurality of kinds include kinds classified on the basis of the shape of the new defect. This increases accuracy in yield estimation, since the new defect having a specific shape is often closely related to defectiveness of a chip.

In the process control method of the twenty-sixth aspect, a plurality of kinds include kinds classified on the basis of a combination of at least two of the following: a detection size of the new defect; the number of new defects in a single chip; the presence or absence of the new defect in at least one specific area of a wafer; and the shape of the new defect. This considerably increases accuracy in yield estimation even when various conditions of the wafer during analysis are different from those during estimation.

In the process control method of the twenty-seventh aspect, the wafer includes a plurality of wafers; and a plurality of chips include every chip formed on a plurality of wafers. This increases the number of chips to be analyzed as compared to the case using only a single wafer, thereby increasing statistic reliability of the yield estimation.

In the process control method of the twenty-eighth aspect, a predetermined identifying condition includes a new-defect judgement condition that a new defect out of the new defect which is detected but judged as having no influence on yield should not be regarded as the new defect. Thus, an yield can be estimated with high accuracy on the basis of the statistically highly reliable analysis result.

At the step (h) of the process control method of the twenty-ninth aspect, after the step (g), a total estimated yield of a plurality of new processes is corrected to a correction value that is obtained through an analysis of a total estimated yield of a plurality of past processes and an actual yield. This increases accuracy in yield estimation.

The step (f) of the process control method of the thirtieth aspect includes a step of calculating a middle estimated yield of a predetermined number of processes out of the plurality of new processes, on the basis of an estimated yield of each of the predetermined number of processes. This increases accuracy of the middle estimated yield of the predetermined number of processes.

Accordingly, an object of the present invention is to provide the defect analysis method which makes it possible to quantitatively grasp the influence of the number of defects due to only a single process out of a plurality of processes on the yield of the device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 illustrates a comparison between the presence or absence of a new defect having a specific distribution in each chip and defectiveness or non-defectiveness of each chip on a wafer map according to a defect analysis method of a seventh preferred embodiment.

FIG. 15 illustrates a classification of chips according to the seventh preferred embodiment.

DESCRIPTION OF THE PREFERRED EMBODIMENTS

0. Precondition

Figure 1:
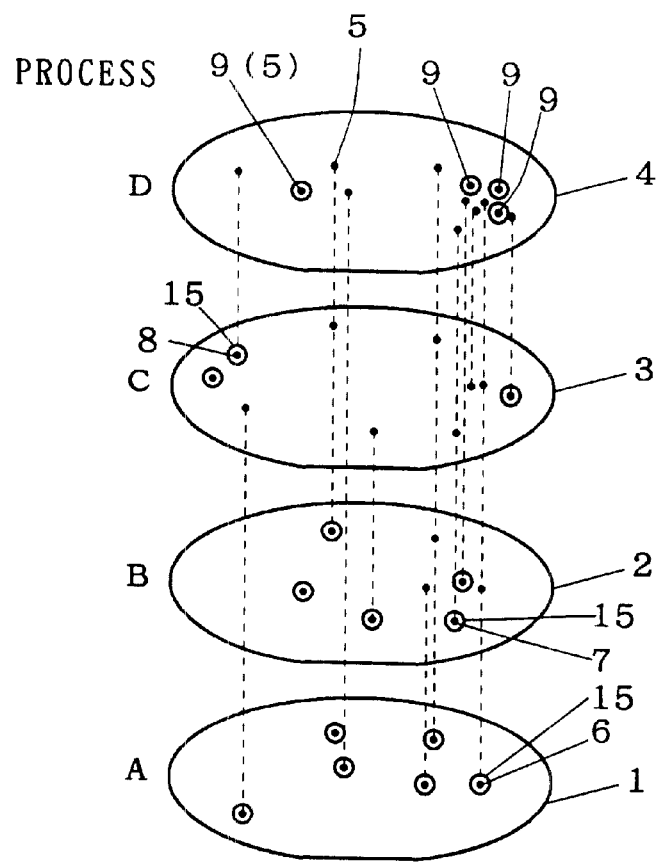
FIG. 1 illustrates a method for detecting a new defect.

Inspection of a plurality of processes uses a method for extracting only a new defect of a specified process while excluding coordinates of a defect detected in the previous measurement and its margin of error (hereinafter referred to as an extraction of new defects).

In such a method for extracting a new defect, however, there is not much correlation between the yield of a device and the number of new defects detected after a middle process.

There are mainly two reasons for this. First, a single chip can contain an aggregate defect including an unusual number of defects. This often increases the number of new defects in proportion to the number of defective chips in a wafer, thereby shading the original meaning of the number of new defects to the yield of the device.

Secondly, even if only a new defect of a specified process is extracted, the other processes can be the cause of yield deterioration. In such a case, the number of new defects is also meaningless to the yield of the device.

Further, for a RAM including a redundancy circuit for saving a chip itself by cutting off a destroyed part in case of partial destruction of elements due to a defect, since the number of savable chips is limited, whether a chip becomes defective or not is irregular in relation to the size or the number of defects. In such a case, there is lesser correlation between the number of new defects and the yield of the device.

In this way, separately considering the influence of each process and the influence of an aggregate defect results in a low correlation between the number of new defects and the yield of the device. Thus, the influence of a single process on yield cannot be quantitatively recognized from a simple extraction of new defects. This requires further improvement in the method.

The following first to twelfth preferred embodiments of the present invention provide defect analysis methods of a device which includes an integrated circuit formed on each of a plurality of chips on a wafer through a plurality of processes.

1. First Preferred Embodiment

1—1. Principle

Described in a first preferred embodiment is a defect analysis method focusing on a new defect of a specified process out of a plurality of manufacturing processes. To be concrete, a device is manufactured through six processes A to F, and an inspection apparatus carries out a defect inspection after each of the processes A to F.

In manufacturing a DRAM through the six processes A to F: for example, A is a process for forming a rough oxide film pattern; B is a process for forming a transistor (for a memory cell array or for controlling a memory cell array); C is a process for forming a capacitor (for a memory cell); D is a process for forming an (interlayer) insulating film; E is a process for forming a (row-direction) metal wire; and F is a process for forming a (column-direction) metal wire.

In the following description, the process D out of the six processes A to F is focused on as a specified process to be analyzed.

First, a new defect 9 of the process D is detected. As shown in FIG. 1, there are a large number of defects 5 on a wafer map 4, such as a pattern defect, a particle, adhesion of contaminants, and damage. Of these defects 5 on the wafer map 4, judged as the new defect 9 is a defect due to only the process D, occurring in a new area other than an area including coordinates of new defects 6 to 8 of the previous processes A to C detected on wafer maps 1 to 3, and their margins of error 15.

Figure 2:
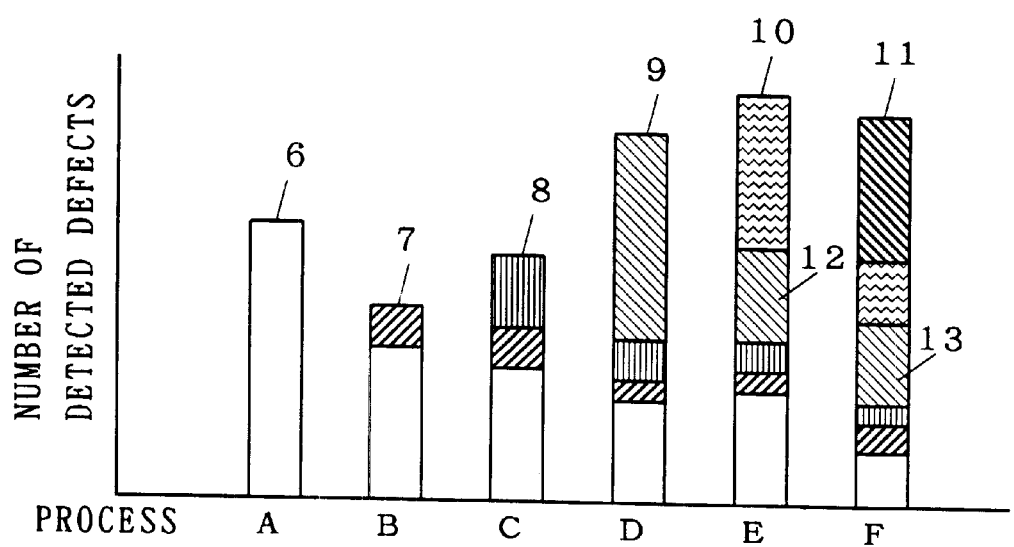
FIG. 2 is a graph showing a correlation between the number of defects detected after each step and the number of new defects of each process.

That is, as shown in the graph of FIG. 2, the number of new defects 9 is obtained by subtracting the number of defects on the same coordinates as the new defects 6 to 8 of the previous processes A to C and their margins of error 15, from the total number of defects 5 of the process D on the wafer map 4.

Next, after all the processes A to F are completed, an electric tester for judging whether an electrical operation goes well or not, makes a defective/non-defective judgement on each of the integrated circuits formed on every chip on the wafer. The electric tester makes such a defective/non-defective judgment generally on the basis of a total result of several partial electric tests on specific electrical characteristics.

Figure 3:
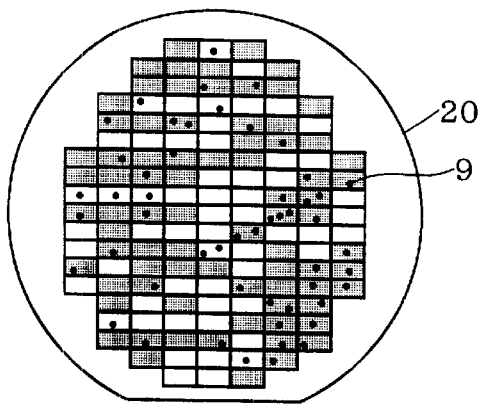
FIG. 3 illustrates a comparison between the presence or absence of a new defect in each chip and defectiveness or non-defectiveness of each chip on a wafer map according to the defect analysis method of a first preferred embodiment.

Then, on a wafer map 20, a plurality of chips judged by the presence or absence of the new defects 9 of the process D are compared with a plurality of chips judged by their defectiveness or non-defectiveness as shown in FIG. 3. As can be seen from the drawing, there are 52 new defects of the process D distributed among 45 chips. The tester detects 78 defective chips and 57 non-defective chips, making a total of 135 chips.

These 135 chips are classified into four groups: ① non-defective chip with no new defect (48 chips in this case); ② defective chip with no new defect (42 chips); ③ non-defective chip with new defect (9 chips); ④ defective chip with new defect (36 chips).

According to this preferred embodiment, a chip with more than one new defect and a chip with only one new defect are classified into the same group, namely, "chip with new defect". Although the chip with more than one defect can be sequentially weighed according to the number of defects therein, such weighing is not considered in the calculations of this preferred embodiment. Thus, not the number of new defects in a chip but the number of chips having a new defect matters in the following analysis procedure. Accordingly, even a chip with an aggregate defect can be classified as a single chip into either the group ③ or ④. Thus, the classification is hardly affected by the aggregate defect.

We will now consider why the chips should be classified into the four groups. The groups ③ and ④ with new defect are affected by the process D, while the groups ① and ② are not. Thus, the groups ① and ② have better yields than the groups ③ and ④, but they may be affected by the processes A, B, C, E, F. When the groups ③ and ④ are not affected by the process D, yields of the groups ③ and ④ are considered to be the same as those of the groups ① and ②.

A percent defective RB1 of the groups ① and ② (=1-percent non-defective=1-yield) can be expressed as:

$$RB1 = ②/(①+②) = 42/(48+42) \quad (I)$$

Applying this to the groups ③ and ④, the number of defective chips NE due to the five processes A, B, C, E, F except D is:

$$NE = (③+④) \times RB1 = (9+36) \times RB1 = 21 \quad (II)$$

Since the actual number of defective chips in the groups ③ and ④ is the number of chips in the group ④, the number of new defective chips N1 considered to be caused only by the new defect of the process D is found by:

$$N1 = ④ - NE = 36 - 21 = 15 \quad (III)$$

Next, a critical rate RF of the new defect of the process D is calculated. First, consider the influence of the process D on the groups ③ and ④ with reference to the percent defective RB1 of the groups ① and ② and a percent defective RB3 of the groups ③ and ④ (=④/(③+④)=36/(9+36)). Suppose that the distribution of the new defects of the process D is uniform over the the groups ③ and ④, according to the law of product of probability, a percent non-defective RG of the process D is found by:

$$RG = rg3/rg1 = 0.375 \quad (IV)$$

where rg1 is a percent non-defective of the groups ① and ② (=①/(①+②)) and rg3 is a percent non-defective of the groups ③ and ④ (=③/(③+④)).

Thus, the critical rate RF of the new defect of the process D is:

$$RF = 1 - RG = 0.625 \quad (V)$$

This indicates that 62.5% of the chips with new defect detected by the inspection apparatus becomes defective. In this case, the remaining 37.5% of the chips with new defect become non-defective. This means that the inspection apparatus gives a highly sensitive measurement. In this manner, an index of sensitivity of the inspection apparatus can be calculated from the critical rate.

As long as equally distributed over the groups ③ and ④, the new defects of the process D do not have to be equally distributed over all 135 chips across the wafer.

Next, the number of defective chips occurring at the process D is calculated. Since 62.5% of the chips with new defect become defective, the number of process defective chips NB can be found by:

$$NB = (③+④) \times RF = 28.1 \quad (VI)$$

Figure 5:
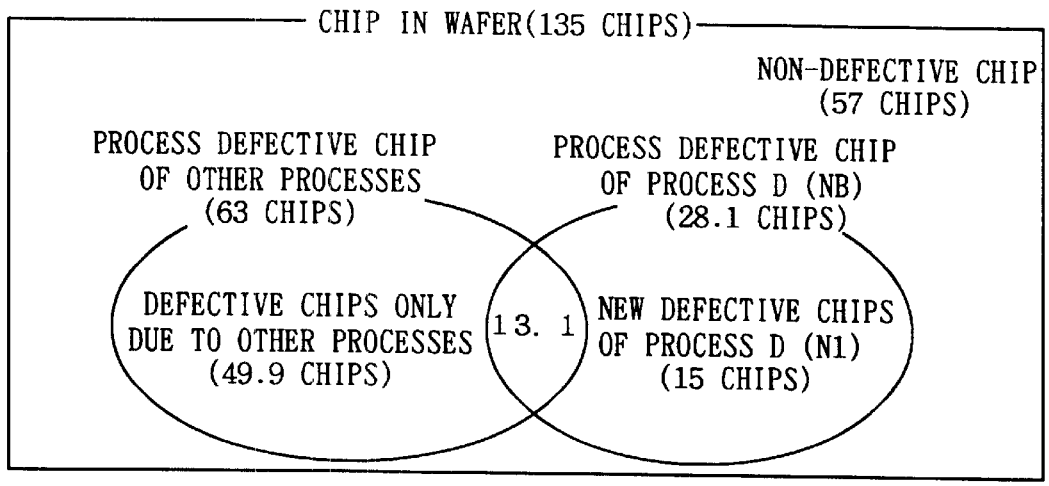
FIG. 5 illustrates an analysis result in the Venn's diagram according to the first preferred embodiment.

These analysis results are summarized in the Venn diagram in FIG. 5. Out of 135 chips across the wafer, there are 57 non-defective chips, and 78 defective chips. Of 78 defective chips, there are 28.1 process defective chips NB occurring at the process D. This number includes 15 new defective chips Ni due to only the process D. That is, 13.1 defective chips (28.1−15) are considered to be caused by one or more of the five processes A, B, C, E, F, irrespective of D.

Of 78 defective chips, 63 defective chips (78−15) are caused by one or more of the processes A, B, C, E, F. That is, even if every cause of defectiveness due to the process D is eliminated and the number of process defective chips of the process D is reduced from 28.1 to zero, the number of non-defective chips is increased only by 15 and there still remains 63 defective chips. In this way, an increasable number of non-defective chips when the defectiveness due to the process D is perfectly eliminated can be quantitatively recognized from the number of new defective chips Ni of the process D.

On the other hand, the number of process defective chips NB (=28.1 chips) obtained on the basis of the critical rate of the process D indicates the number of chips which will be defective even with 100% yield of the processes A, B, C, E, F. That is, the number of process defective chips NB quantitatively shows the influence of a single process D on the yield of the device. As the number increases, worse influence is given on yield.

Although the number of chips is not an integer in some cases, the use of such number as an analysis result does not matter since the calculations are based on a hypothesis such as uniformity of the defect distribution. In this preferred embodiment, as described above, the influence of a single process on yield can be quantitatively calculated.

1–2. Method

Figure 6:
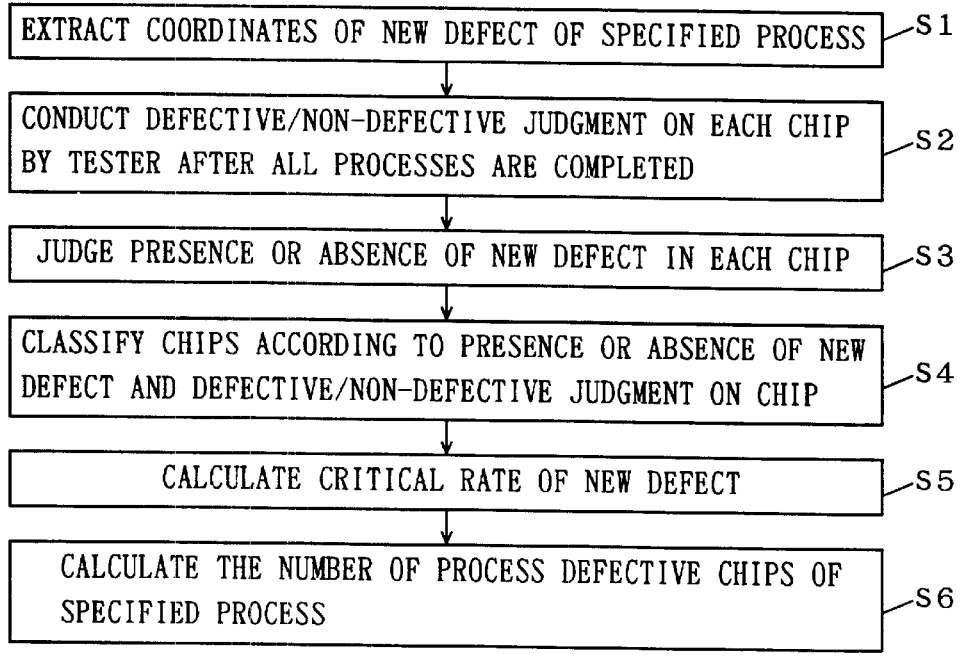
FIG. 6 is a flow chart showing the procedures of the method according to the first preferred embodiment.

FIG. 6 is a flow chart showing the defect analysis method according to the first preferred embodiment of the present invention. With the process D shown in FIGS. 1 and 2 as a specified process, a flow of the procedures of the first preferred embodiment will be described.

With reference to FIG. 6, S1 is a step of extracting coordinates of a new defect due to a specified process and a detection size of the new defect after the specified process by an inspection apparatus; S2 is a step of judging whether each chip is defective or non-defective after all the processes by an electric tester; and S3 is a step of judging the presence or absence of a new defect in each chip on the identifying condition that any new defect is effective.

Figure 4:
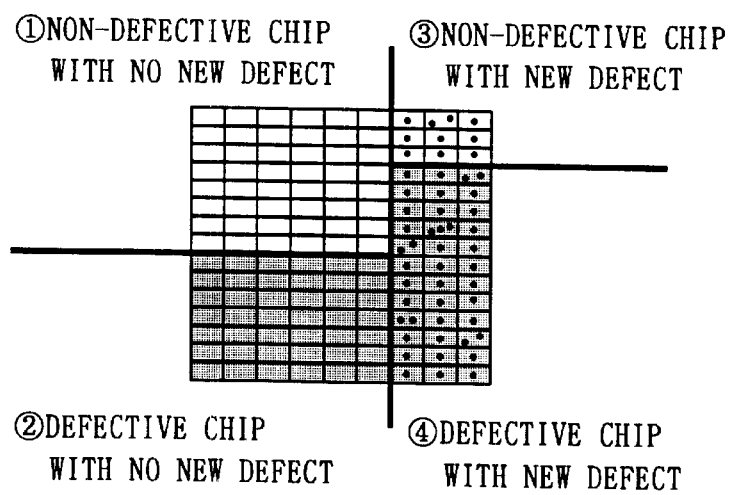
FIG. 4 illustrates a classification of chips according to the first preferred embodiment.

Next, at a step 4, the new defects detected at the step S3 and the result of the defective/non-defective judgment of the step S2 are compared on a wafer map as shown in FIG. 3, by which the chips are classified into four groups ① to ④ as shown in FIG. 4.

At a step S5, on the basis of the numbers of chips classified into four groups, a percent defective RB1 of the groups ① and ②, the number of defective chips NE due to the processes other than the specified process, and the number of new defective chips N1 due to only the new defects of the specified process are calculated from the equations (I) to (III), respectively. From the number of new defective chips N1, an reducible number of defective chips when an improvement is made in the specified process can be quantitatively recognized.

At a step S6, a critical rate RF of the new defects of the specified process is obtained on the basis of a percent non-defective RG which is calculated from a percent non-defective rg1 of the groups ① and ② and a percent non-defective rg3 of the groups ③ and ④, using the equations (IV) and (V). From the critical rate RF, sensitivity of the inspection apparatus for inspecting a defect after the specified process can be quantitatively recognized.

Figure 7:
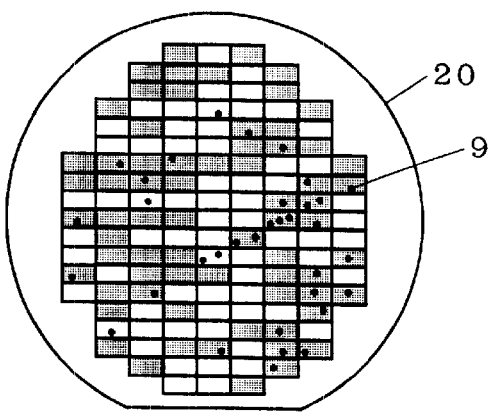
FIG. 7 illustrates a comparison between the presence or absence of a new defect of 1 $\mu$m or more in each chip and defectiveness or non-defectiveness of each chip on a wafer map according to a defect analysis method of a second preferred embodiment.

Then, at a step S7, the number of process defective chips NB occurring at the specified process is calculated from the equation (VI). This makes it possible to quantitatively recognize the influence of the specified process on the yield of the device 2. Second Preferred Embodiment 2–1. Principle As is the case with the first preferred embodiment, a method according to a second preferred embodiment focuses on the new defects of the process D. First, only the new defects 9 detected for the first time at the process D are extracted in the same way as the first preferred embodiment (see FIGS. 1 and 2). Then, as shown in FIG. 7, a plurality of chips judged by the presence or absence of the extracted new defect 9 of the process D are compared to a plurality of chips judged by their defectiveness or non-defectiveness, on a wafer map by an electric tester.

In the second preferred embodiment, the presence or absence of the new defect 9 is judged not on the condition that any new defect 9 is effective as in the first preferred embodiment, but on the condition that only a new defect 9 of a predetermined size (e.g. 1 μm) or more is effective. The second preferred embodiment differs in this point from the first preferred embodiment. The other procedures are similar to those of the first preferred embodiment.

Figure 8:
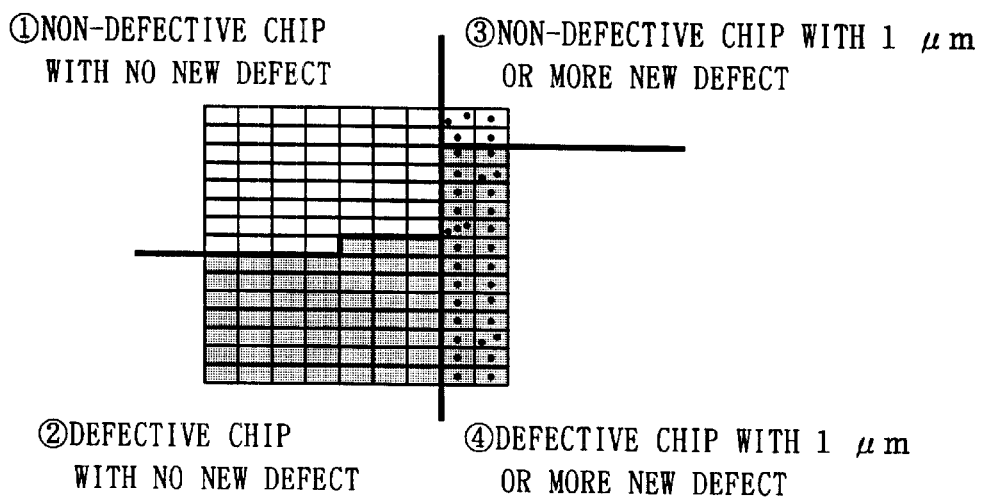
FIG. 8 illustrates a classification of chips according to the second preferred embodiment.

There are 34 new defects 9 of the process D of 1 μm or more, distributed among 30 chips. As is the case with first preferred embodiment, there are 78 defective chips and 57 non-defective chips, making a total of 135 chips. These 135 chips are classified into four groups as shown in FIG. 8: ① non-defective chip with no new defect (53 chips); ② defective chip with no new defect (52 chips); ③ non-defective chip with new defect (4 chips); and ④ defective chip with new defect (26 chips).

The number of new defective chips N1 considered to be caused only by the new defects of the process D of 1 μm or more, is calculated from the equations (I) to (III) in the same way as the first preferred embodiment. This gives:

$$N1=④-(③+④)×②/(①+②)=26-(4+26)×52/(53+52)=11.1$$

These 11.1 chips are considered to be caused only by the new defects of the process D of 1 μm or more.

Then, the critical rate RF of the new defects 9 of the process D of 1 μm or more is calculated from the equations (IV) and (V) in the same way as the first preferred embodiment. This gives:

$$RF = 1 - RG = 1 - ③/(③ + ④)×(① + ②)/①$$
$$= 1 - 4/(4+26)×(53+52)/53 = 0.736$$

This indicates that 73.6% of the chips with new defect detected by the inspection apparatus become defective. Since the defects larger in size than that of the first preferred embodiment are specifically calculated in the second preferred embodiment, the number of non-defective chips with new defect can be reduced as compared to the first preferred embodiment. Here, the remaining 26.4% of the chips with new defect becomes non-defective. This means that the inspection apparatus gives a highly sensitive measurement. Thus, the critical rate RF can be an index of the sensitivity of the inspection apparatus.

Next, for the detection size of 1 μm or more, the number of process defective chips NB of the process D is calculated. Since 73.6% of the chips with new defect become defective, applying the critical rate RF to the equation (VI), the number of process defective chips NB is found by:

$$NB=(③+④)×RF=(4+26)×0.736=22.1$$

The same procedures are further performed for several detection sizes, for example, 2 μm or more, 3 μm or more, ..., to obtain the number of new defective chips N1, the critical rate RF, and the number of process defective chips NB for each detection size. These analysis results are summarized in Table 1.

TABLE 1

| Detection Size | All | ≧1 μm | ≧2 μm | ≧3 μm |
|---|---|---|---|---|
| Critical Rate (RF) | 0.625 | 0.736 | 1.0 | 1.0 |
| Number of New Defective Chips (N1) | 15 | 11.1 | 4.1 | — |
| Number of Process Defective Chips (NB) | 28.1 | 22.1 | 9 | — |

For the detection size of not less than 2 μm, the critical rate is 1.0 (100%) as shown in Table 1. This indicates that a new defect of 2 μm or more is an absolute critical defect which always causes a chip to be defective, thereby always causing deterioration in yield. This cannot be overlooked in the management of device manufacturing.

Further, when any detection size (All) is effective, the number of process defective chips NB is at its maximum(= 28.1). These 28.1 chips show the influence of the process D on yield more accurately. Thus, the detection size with the maximum number of process defective chips NB is considered to be an optimum sensitivity of the inspection apparatus, as long as the size is not excluded from the condition because of its too low critical rate RF. In Table 1, the optimum setting of sensitivity is to detect all defects of any size.

In this way, the number of new defective chips N1, the critical rate RF, and the number of process defective chips NB are calculated for each detection size, and those calculated results are compared to obtain the size of a new defect to be the absolute critical defect and the detection size to be the optimum sensitivity of the inspection apparatus.

Further, according to the second preferred embodiment, the number of process defective chips NB in the optimum setting of sensitivity (detection size) makes it possible to quantitatively calculate the influence of the process on yield with higher accuracy as compared with the first preferred embodiment.

2—2. Method

Figure 9:
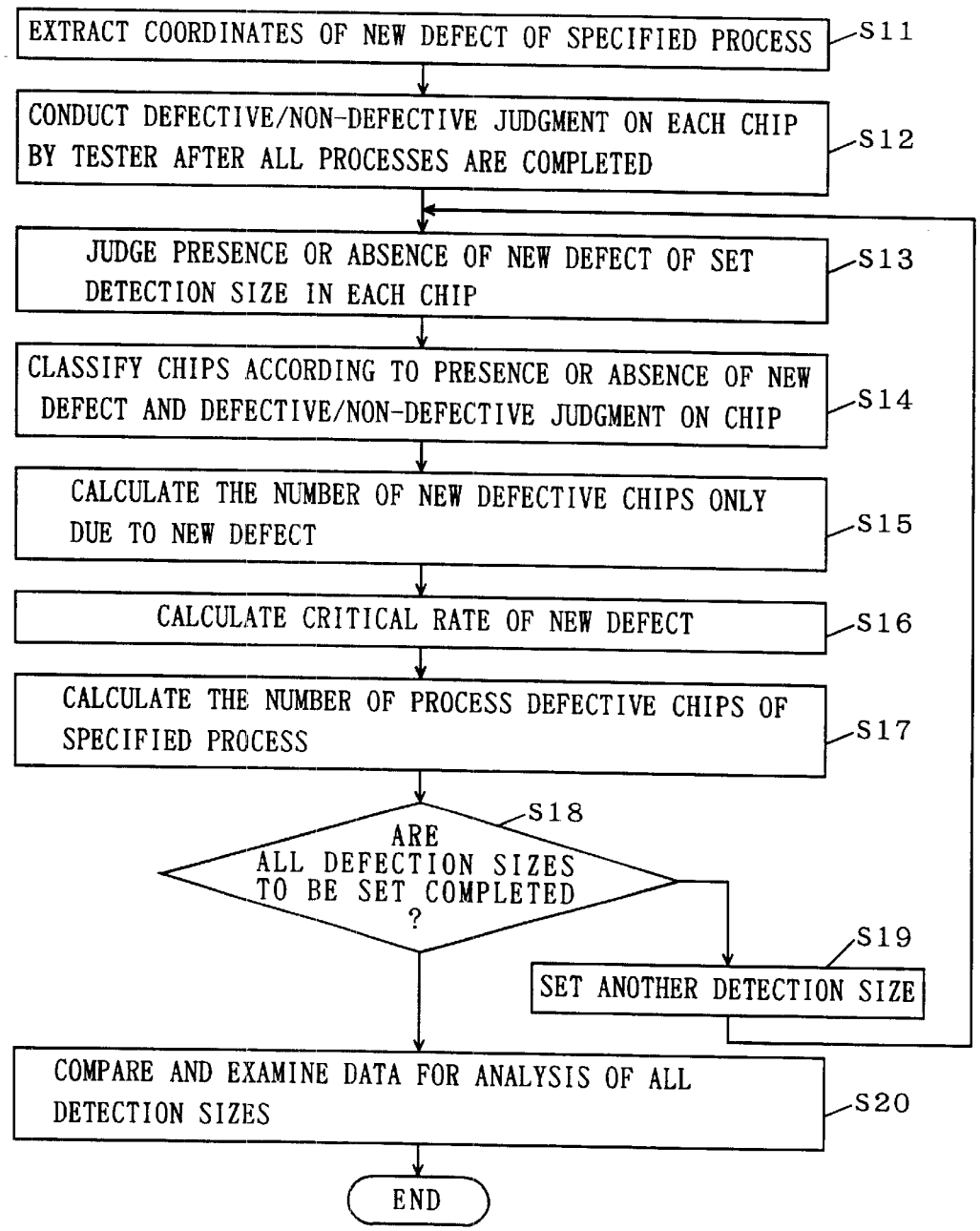
FIG. 9 is a flow chart showing the procedures of the method according to the second preferred embodiment.

FIG. 9 is a flow chart showing the defect analysis method according to the second preferred embodiment of the present invention. With the process D shown in FIGS. 1 and 2 as a specified process, a flow of the procedures of the second preferred embodiment will be described.

With reference to FIG. 9, S11 is a step of extracting coordinates of the new defects of the specified process; S12 is a step of judging whether each chip is defective or non-defective after all the processes by an electric tester; and S13 is a step of judging the presence or absence of a new defect of a predetermined detection size or more in each chip.

Then, through steps S14 to S17, the number of new defective chips N1, the critical rate RF, and the number of process defective chips NB of the specified process are obtained for a predetermined detection size to be data for analysis. The procedures of the steps S14 to S17 are similar to those of the steps S4 to S7 of the first preferred embodiment shown in FIG. 6.

Then, whether all the detection sizes to be examined have been completed or not is judged at a step S18. If the answer is "no", another size is set at a step S19, and the number of new detective chips N1, the critical rate RF, and the number of process defective chips NB for that detection size are obtained as data for analysis through the steps S13 to S17. The procedures of the steps S13 to S17 and S19 are repeated until the completion of all the detection sizes is detected at the step S18.

When the calculations for all the detection sizes have been completed, the procedure proceeds to a step S20 of comparing and examining all the data for analysis for all the detection sizes to determine an absolute critical defection size which is the minimum detection size to obtain the critical rate RF of 1.0; the maximum number of process defective chips NBMAX out of the numbers of process defective chips NB for all the detection sizes; and an optimum-sensitivity detection size corresponding to the maximum number of process defective chips NBMAX. From the maximum number of process defective chips NBMAX, the influence of the process D on the yield of the device can be recognized with accuracy.

2–3. Additional Note

While the detection size is divided by 1 $\mu$m in the second preferred embodiment, it can be divided by a smaller unit, or if necessary, by an irregular unit. Further, while the absolute critical detection size is 2 $\mu$m or more in the second preferred embodiment, it does not necessarily agree with the actual size of a defect measured by an electron microscope.

While the index of sensitivity is the detection size in the second preferred embodiment, it is possible to use other indexes, such as intensity of scattered light, as long as the index is proportional to the detection size ($\mu$m). Further, even if the defects are not continuously indicated by size and divided only into three groups: large; medium; and small, analysis can be performed by obtaining data for analysis for each group as in the second preferred embodiment.

3. Third Preferred Embodiment

3–1. Principle

In the aforementioned second preferred embodiment, only the defects of the specified process (D) out of a plurality of processes are analyzed for each detection size. In a third preferred embodiment, on the other hand, the defect analysis is performed for all the processes, using the same method and focusing on the same wafer as described in the second preferred embodiment.

Like the second preferred embodiment, the third preferred embodiment makes it possible to recognize the absolute critical detection size, the optimum setting of sensitivity, and the influence of the process on yield in the optimum setting of sensitivity for each process from the data for analysis. Since the defect analysis always uses the maximum number of process defective chips NBMAX in the optimum setting of sensitivity, the influence of each process on yield can be recognized even if there is a difference in sensitivity between the inspection apparatus recipes which are different in each process; or a defect which may be small when detected but become so large as to break through upper and lower layers; or a difference in the size of defects due to the influence of roughness of a device pattern of each layer.

Thus, all the processes can be ranked in order of requiring improvement by simply sorting the maximum numbers of process defective chips of all the processes in descending order.

In addition, this method is applicable to any type or generation of devices, even to a DRAM having an irregular relation between the size and the number of defects because of its bit-relief mechanism. This is because the data for analysis is obtained by comparing the presence or absence of a new defect in each chip, and defectiveness or non-defectiveness of each chip by an electric tester.

3–2. Method

Figure 10:
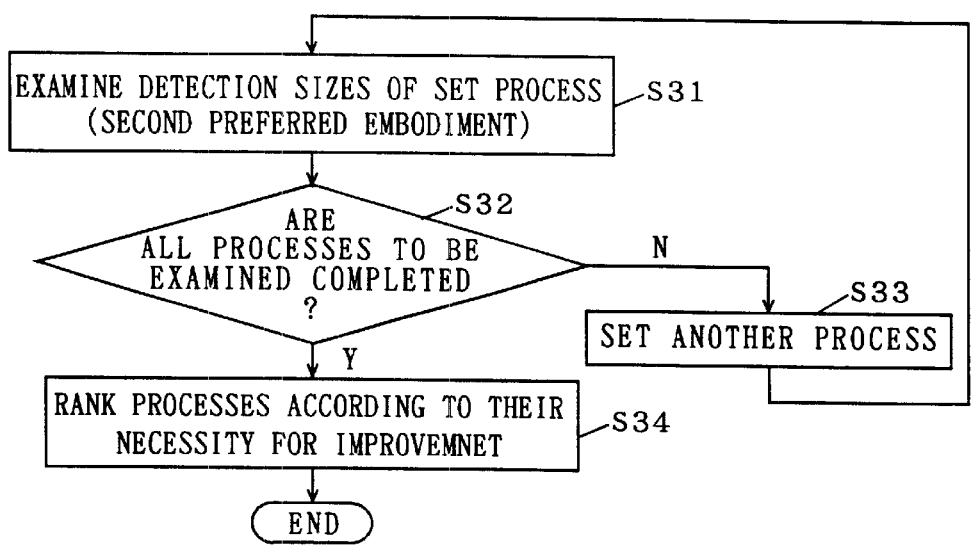
FIG. 10 is a flow chart showing the procedures of a method according to a third preferred embodiment.

FIG. 10 is a flow chart showing a defect analysis method according to the third preferred embodiment of the present invention.

With reference to FIG. 10, S31 is a step of comparing and examining each detection size of a specified process (the procedure of the second preferred embodiment).

Then, whether the examination of all the processes has been completed or not is judged at a step S32. If the answer is "no", another process is set at a step S33 and the procedure returns to the step S31. The steps S33 and S31 are repeated until the completion of all the processes is detected at the step S32.

When the examinations have been completed for all the processes, the maximum numbers of process defective chips of all the processes are compared at a step S34 to sort those processes in order of requiring improvement.

4. Fourth Preferred Embodiment

4–1. Principle

Using the defect analysis method of the third preferred embodiment, the number of new defective chips N1 in the optimum setting of sensitivity for each process is recognized as the number of optimum-sensitivity new defective chips N1BEST. In Table 1, for example, the number of new defective chips N1 (=15) when any detection size is effective is the number of optimum-sensitivity new defective chips N1BEST.

Next, a total number of new defective chips N1TOTAL is obtained by adding up the numbers of optimum-sensitivity new defective chips N1BEST for all the processes. A comparison between the total number of new defective chips N1TOTAL and the actual number of defective chips detected by an electric tester shows a degree to which the cause of defectiveness is detected by an inspection apparatus for detecting a defect of each process.

For example, when a total number of new defective chips N1TOTAL agrees with or approximates the actual number of defective chips, the inspection apparatus is considered to have detected most of new defects causing defectiveness. On the contrary, when the total number of new defective chips N1TOTAL is much less than the actual number of defective chips, it is considered that the actual condition is quite different from the precondition defined for the aforementioned equations (I) to (VI): if not affected by the process D, the groups ③ and ④ will have the same yield as the groups ① and ②.

Further, when the total number of new defective chips N1TOTAL is a little short of the actual number of defective chips, the cause of this can lie in a defect such as a failure in film quality which cannot be detected by an inspection apparatus, or too low sensitivity in the inspection. Of course, these reasons can be combined.

As described above, the comparison between the total number of new defective chips N1TOTAL and the actual number of defective chips makes it possible to quantitatively calculate a degree to which the cause of defectiveness can be detected by an inspection apparatus for defecting a defect of each process.

4–2. Method

Figure 11:
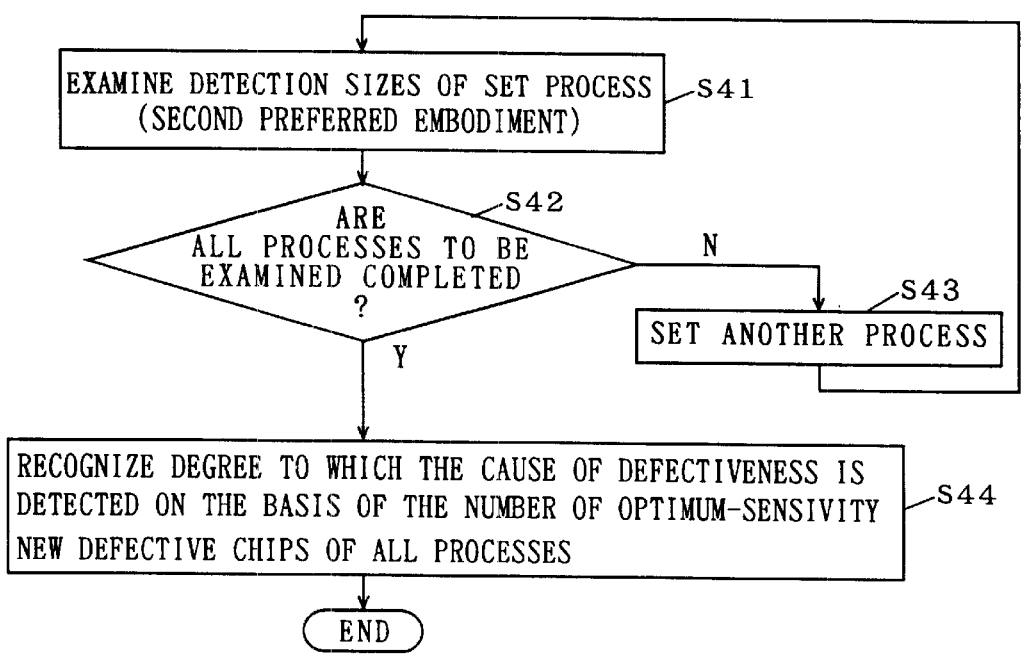
FIG. 11 is a flow chart showing the procedures of a method according to a fourth preferred embodiment.

FIG. 11 is a flow chart showing a defect analysis method according to the fourth preferred embodiment of the present invention.

With reference to FIG. 11, S41 is a step of comparing and examining each detection size of the specified process (the procedure of the second preferred embodiment).

Then, whether the examinations have been completed for all the processes or not is judged at a step S42. If the answer is "no", another process is set at a step S43 and the procedure returns to the step S41. The steps S43 and S41 are repeated until the completion of all the processes is judged at the step S42.

When the examinations for all the processes have been completed, at a step S44, the total number of new defective chips N1TOTAL obtained by adding up the numbers of optimum-sensitivity new defective chips N1BEST for all the processes are compared to the actual number of defective chips detected by an electric tester, to quantitatively recognize the degree to which the cause of defectiveness can be detected.

5. Fifth Preferred Embodiment

5–1. Principle

The absolute critical detection size and the optimum setting of sensitivity for each process can be recognized by applying the defect analysis method of the second preferred embodiment to all the processes. If the measured data to be the base of this analysis is inspected by different inspection apparatuses, the level of sensitivity of each inspection apparatus can be recognized on the basis of the critical rate for a predetermined detection size.

In the defect analysis method of a fifth preferred embodiment, a difference in sensitivity between inspection apparatus recipes which are different in each process are compared and examined by measuring wafers which are assumed to have defects in the same or similar condition. For example, when the results of defect detection by a different inspection apparatus is as shown in Table 1, a difference in sensitivity between different inspection apparatus recipes can be simply recognized by comparing the critical rates RF for the detection size of 1 $\mu$m or more, without any complicate procedure.

The detection size to be used for comparison in the defect analysis method of the fifth preferred embodiment can be set as follows: the sensitivity of each inspection apparatus recipe in measurement is set to be high enough not to detect a pattern or the like as a defect by mistake, and then after new defects are extracted, a detection size that is smaller than an appropriate sensitivity is eliminated for an individual use.

5–2. Method

Figure 12:
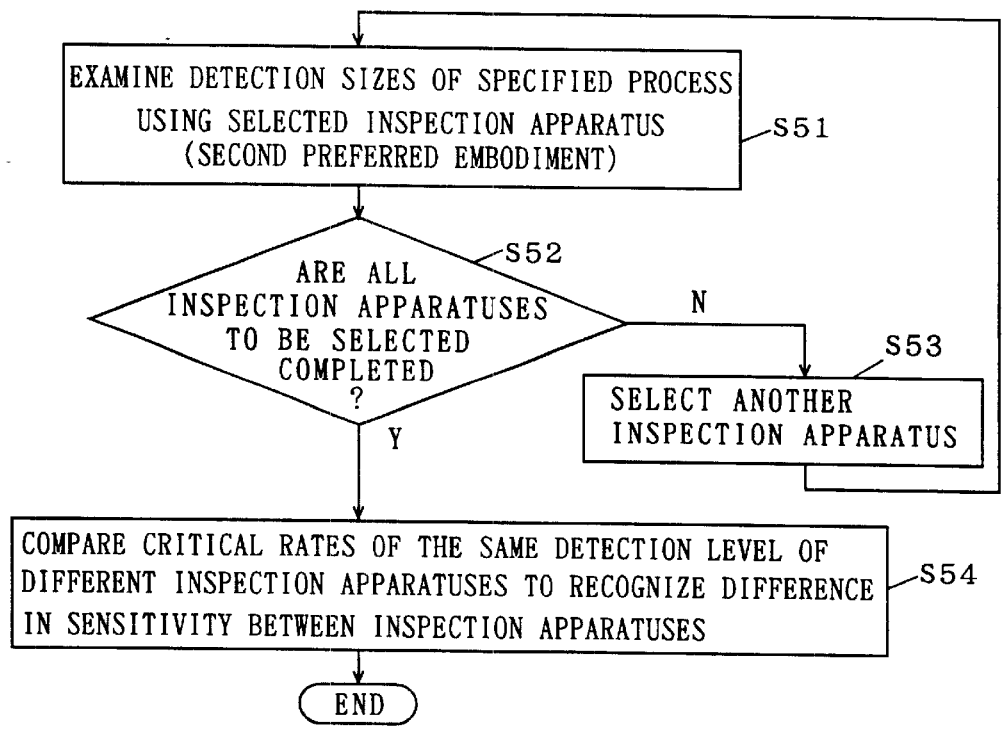
FIG. 12 is a flow chart showing the procedures of a method according to a fifth preferred embodiment.

FIG. 12 is a flow chart showing a defect analysis method according to the fifth preferred embodiment of the present invention.

With reference to FIG. 12, S51 is a step of comparing and examining each detection size of a specified process (the procedure of the second preferred embodiment) using a selected inspection apparatus.

Then, whether the selections of all the inspection apparatuses have been completed or not is judged at a step S52. If the answer is "no", another inspection apparatus is selected at a step S53, and the procedure returns to the step S51. The steps S53 and S51 are repeated until the completion of all the inspection apparatuses is detected at the step S52.

When the selections of all the inspection apparatuses have been completed, at a step S54, the critical rates obtained by the different inspection apparatuses for the same detection size are compared to recognize a difference in sensitivity therebetween.

While the detection sizes have been examined at the specified process as shown in FIG. 12, they can be, of course, examined at the other processes.

6. Sixth Preferred Embodiment

6–1. Principle

The defect analysis method of the third preferred embodiment makes it possible to quantitatively recognize the absolute critical detection size, the optimum sensitivity, and the influence of the specified process on yield in the optimum setting of sensitivity.

In a sixth preferred embodiment, superiority or inferiority of each process on different manufacturing lines which manufacture the same device through the same processes, can be recognized by obtaining data for analysis for each manufacturing line on the basis of data measured by different inspection apparatuses.

The influence of each process on yield is, as described in the third preferred embodiment, grasped in consideration of a difference in sensitivity between the inspection apparatus recipes which are different in each process; the defect which may be small when detected but become so large as to break through upper and lower layers; and the influence of roughness of a device pattern of each layer. Thus, superiority or inferiority of each process of different manufacturing lines can be simply recognized by comparing the maximum numbers of process defective chips NBMAX of the same process on the different manufacturing lines.

A defect analysis method of the sixth preferred embodiment thus makes it possible to readily compare the same process on the different manufacturing lines, which was conventionally only possible when there is a correlation in sensitivity between the different inspection apparatuses used for each manufacturing line.

6–2. Method

Figure 13:
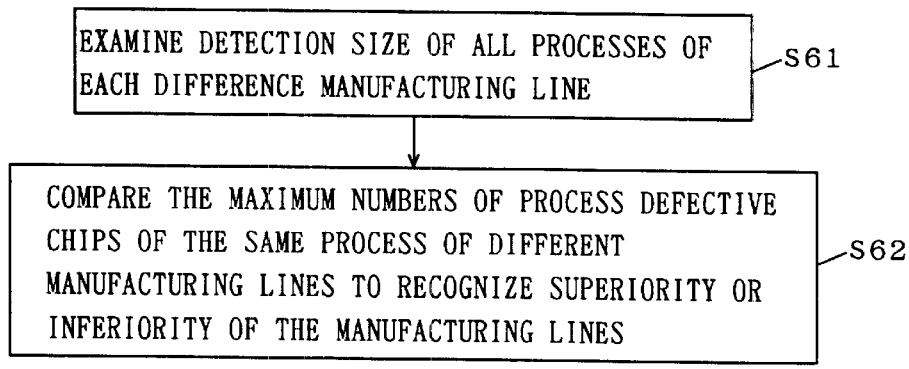
FIG. 13 is a flow chart showing the procedures of a method according to a sixth preferred embodiment.

FIG. 13 is a flow chart showing the defect analysis method according to the sixth preferred embodiment of the present invention.

With reference to FIG. 13, S61 is a step of examining a detection size for all the processes of each manufacturing line (the procedures from the steps S31 to S33 of the third preferred embodiment).

Then, at a step S62, the maximum numbers of process defective chips NBMAX of the same process of different manufacturing lines are compared to recognize superiority or inferiority of those manufacturing lines.

7. Seventh Preferred Embodiment

7–1. Principle

A defect analysis method of a seventh preferred embodiment analyzes only a new defect of the process D having a specific distribution over the wafer map 20 of the first preferred embodiment shown in FIG. 3.

While 135 chips are classified into the four groups in the first preferred embodiment, in this seventh preferred embodiment, chips with new defect are classified into three groups, the groups ③, ④ and a new group ⑤ for a chip with new defect having no specific distribution. This group ⑤ is not used in the calculations of the aforementioned equations (I) to (VI). The other procedures are similar to those of the first preferred embodiment.

As shown in FIG. 14, the presence or absence of a new defect is judged on the identifying condition that a chip with a new defect of the process D having a specific distribution (drawing a straight line up to the right) is effective. The result is compared with the result of defective/non-defective judgment on each chip by an electric tester.

As shown in FIG. 15, there are 12 new defects having a specific distribution, distributed among 7 chips. That is, 135 chips are classified into five groups: ① non-defective chip with no new defect (48 chips); ② defective chip with no new defect (42 chips); ③'non-defective chip with new defect having a specific distribution (1 chip); ④'defective chip with new defect having a specific distribution (6 chips); and ⑤ chip with new defect having no specific distribution (34 chips) (cf. FIG. 15).

Then, the number of new defective chips N1' considered to be caused only by the new defects having a specific distribution, is calculated from the equations (I) to (III) in the same way as the first preferred embodiment where the groups ③, ④ are substituted by ③', ④'; and N by N1'. This gives:

$$N1'=④'-(③'+④')\times②/(①+②)=6-(1+6)\times42/(48+42)=2.7$$

These 2.7 defective chips are considered to be caused only by the new defects having a specific distribution.

Next, a critical rate RF' of the new defects having a specific distribution is calculated from the equations (IV) and (V) where the groups ③, ④ are substituted by ③', ④' and RF by RF'. This gives:

$$RF'=1-RG=1-③'/(③'+④')\times(①+②)/①=1-1/(1+6)\times(48+42)/48=0.732$$

This indicates that 73.2% of the chips with new defect having a specific distribution detected by an inspection apparatus, become defective. The critical rate in this case is higher than that of the first preferred embodiment.

Next, the number of process defective chips NB' caused by the new defects having a specific distribution is calculated. Since 73.2% of the chips with new defect having a specific distribution become defective, applying this rate to the equation (VI) where the groups ③, ④ are substituted by ③', ④', RF by RF', and NB by NB', the number of process defective chips NB' is:

$$NB'=(③'+④')\times RF'=(1+6)\times0.732=5.1$$

Since the number of process defective chips NB was 28.1 in the first preferred embodiment which does not consider the specific distribution, the proportion of the new defects having this linear distribution in the process defective chips NB is 18.1% (5.1/28.1=18.1).

In the seventh preferred embodiment, the number of new defective chips N1', the critical rate RF', and the number of process defective chips NB' are obtained after the chips are classified according to the presence or absence of a new defect having a specific distribution in each chip and the defective/non-defective judgment on each chip by an electric tester. This makes it possible to quantitatively recognize an reducible number of defective chips when an improvement is made in a new defect of a specified process having a specific distribution; sensitivity of the inspection apparatus for detecting a new defect of the specified process having a specific distribution; and the influence of the new defect of the specified process having a specific distribution on the yield of the device.

When the new defects having a specific distribution have a considerable influence on the yield of the device, and the same linear distribution is found on the other wafer on a manufacturing line, those new defects are considered to require earliest improvement in consideration of its critical rate and the number of process defective chips.

Further, characteristics of the new defects having a specific distribution, different from those of the other new defects of the specified process, can be examined by comparing the number of new defective chips N1', the critical rate RF', and the number of process defective chips NB' with the number of new defective chips N1, the critical rate RF, and the number of process defective chips NB which are obtained, with no consideration for a specific distribution, by classifying chips according to the presence or absence of a new defect and the defective/non-defective judgment by an electric tester.

The defect analysis method of the seventh preferred embodiment can be combined with the methods of the other preferred embodiments. For example, several detection sizes can be examined as in the second preferred embodiment, or comparison and examination can be made between processes as in the third preferred embodiment.

Further, since the critical rate RF' of the seventh preferred embodiment is approximate to the critical rate RF for the detection size of 1 $\mu$m or more of the second preferred embodiment, the size of a new defect having a linear distribution can be estimated at 1 $\mu$m or more. However, we cannot draw a sweeping conclusion, because it is also conceivable that the critical rate RF' of the new defects having a linear distribution can be unusually increased by a considerable number of small defects which cannot be detected within the linear distribution. For a DRAM as a manufacturing device, for example, its bit-relief circuits can be all used up by such small defects.

Further, the inspection by the inspection apparatus cannot cover 100% of the chip surface. In such case, a critical defect having a linear distribution can exist where the inspection is not performed.

7-2. Method

The defect analysis method of the seventh preferred embodiment is implementable through similar procedures to those of the first preferred embodiment shown in FIG. 6. In this case, the classifications shown in FIGS. 3 and 4 are substituted by those shown in FIGS. 14 and 15, and the groups ③, ④ by ③', ④', the number of defective chips N1 by N1', the critical rate RF by RF', and the number of process defective chips NB in the equations (I) to (VI) by NB'. In this case, S3 is a step of judging the presence or absence of a new defect having a specific distribution in each chip. In this way, only some parts of the procedures has to be changed to concurrently adopt the methods of the other preferred embodiments.

8. Eighth Preferred Embodiment 8-1. Principle

In the first to seventh preferred embodiments, the defective/non-defective judgment on a chip is made on the basis of total electrical characteristics of the chip based on various partial electric tests by an electric tester In defect analysis of this eighth preferred embodiment, on the other hand, defective/non-defective judgment on a chip is made on the basis of a specific electrical characteristic based on a partial electric test for detecting a failure of the specific electrical characteristic.

For instance, whether a chip is defective or non-defective is judged on the basis of a specific electrical characteristic based on a partial electric test. The partial electric test detects, for example, an overcorrect failure due to short of wires, an operating failure on a certain condition, and a failure according to the value of overcurrent.

Then, after chips are classified according to the presence or absence of a new defect and the defective/non-defective judgment based on the partial electric test, the number of new defective chips N1, the critical rate RF, and the number of process defective chips NB are obtained as in the first preferred embodiment. This makes it possible to quantitatively recognize the number of chips capable of reducing failures of the specific electrical characteristic with an improvement in a specified process; the sensitivity of the inspection apparatus to make a defective/non-defective judgment on the specific electrical characteristic; and the influence of the new defect of the specified process on the yield of the device in relation to the specific electrical characteristic.

The defect analysis method of the eighth preferred embodiment allows recognition of the influence of the new defects on the failure of the specific electrical characteristic. This makes it possible to recognize the influence of the failure of the specific electrical characteristic on the whole wafer by making a defective/non-defective judgment using both the defect analysis method of the eighth preferred embodiment, and an off-line test method for the failure of the specific electrical characteristic, such as observation of device section, which is so time-consuming that a lot of examples cannot be analyzed.

Further, since the failure of the specific electrical characteristic is often due to the defect having a specific distribution as described in the seventh preferred embodiment, it is efficient to incorporate the method of the eighth preferred embodiment into the method of the seventh preferred embodiment.

Further, when the cause of failure detected by the inspection apparatus cannot be limited by comparing the total number of new defective chips N1TOTAL and the number of defective chips obtained from the total test by an electric tester as described in the fourth preferred embodiment, the cause of the failure of the specific electrical characteristic is narrowed down by the defect analysis method of the eighth preferred embodiment. This makes it possible to select an appropriate method for inspecting the narrowed cause of the failure out of a plurality of time-consuming off-line test methods, thereby permitting speedy discovery of the cause of the failure.

8–2. Method

The defect analysis method of the eighth preferred embodiment is implementable through similar procedures to those of the first preferred embodiment shown in FIG. 6. However, the detective/non-detective judgment on a chip of the step S3 has to be made on the basis of the cause of the failure of the specific electrical characteristic. When the method of the seventh preferred embodiment is concurrently used, S3 is a step of judging the presence or absence of a new defect having a specific distribution for a predetermined detection size. In this way, only the corresponding parts of the procedures have to be changed when the methods of the other preferred embodiments are concurrently used.

9. Ninth Preferred Embodiment

9–1. Principle

In the first to eighth preferred embodiments, only the new defects of each process are used as data for analysis. In the defect analysis method according to a ninth preferred embodiment, on the other hand, a re-defect which is a new defect of the previous process but occurs again at the subsequent process, is also detected as data in consideration of its influence on the subsequent process.

With reference to FIG. 2, for example, the reference numeral 12 indicates a re-defect which is a new defect 9 of the process D but detected again at the process E. Such detection of the re-defect makes it possible to quantitatively recognize the influence of such a defect that may be small when detected but become large at the subsequent process.

Used as data for analysis is not only the re-defect (12 in FIG. 2) of the subsequent process right after the process at which new defect is detected, but also a re-defect of processes thereafter indicated by 13.

After chips are classified according to the presence or absence of a re-defect and defective/non-defective judgment by an electric tester, the number of new defective chips N1, the critical rate RF, and the number of process defective chips NB are obtained as in the first preferred embodiment. This makes it possible to quantitatively recognize a reducible number of defective chips when an improvement is made in a new defect of a specified process (the process D for the re-defect 12 in FIG. 2), the sensitivity of the inspection apparatus for inspecting a new defect of the specified process, and the influence of the new defect of the specified process on the yield of the device.

Further, a correlation between the detection sizes of the re-defect and the new defect can be recognized by comparing, for each detection size, a critical rate which is obtained by a first classification according to the presence or absence of a new defect and defective/non-defective judgment by a tester, and a critical rate which is obtained by a second classification according to the presence or absence of a re-defect of that new defect and defective/non-defective judgment by a tester. When the critical rate of the new defect of the process D of 1 $\mu$m or more is approximate to the critical rate of the re-defect of the process E of 2 $\mu$m or more, it can be estimated that the new defect of the process D of about 1 $\mu$m is grown to about 2 $\mu$m at the process E.

9–2. Method

The defect analysis method of the ninth preferred embodiment is implementable through similar procedures to those of the first preferred embodiment shown in FIG. 6. However, a "new defect" at the steps S3 and S4 is substituted by a "re-defect". Further, when the method of the seventh preferred embodiment is concurrently used, S3 is a step of judging the presence or absence of a re-defect having a specific distribution in each chip. In this way, only the corresponding parts have to be changed when the methods of the other preferred embodiments are concurrently used.

9–3. Additional Note

A re-defect to be analyzed is not necessarily classified individually as 12 and 13 in FIG. 2. Data for analysis can be a combination of a new defect 10 and a re-defect 12 shown in FIG. 2 (a total of a new defects, and a re-defect of a new defect of the previous process). Of the new defects for a predetermined detection size, further, only a new defect satisfying a condition which is decided manually or automatically from an observation using a microscope, for example, can be used as data for analysis.

In this manner, on the basis of the presence or absence of a desirably classified defect and the detective/non-detective judgment, chips are classified into four groups as in the first preferred embodiment shown in FIG. 4, or into five groups one of which is not used for calculations, as in the seventh preferred embodiment shown in FIG. 12. This allows defect analysis of a new defect satisfying various conditions.

10. Tenth Preferred Embodiment

10–1. Principle

While data for analysis is a defect only on a single wafer in the first to ninth preferred embodiments, in this tenth preferred embodiment, defects on a plurality of wafers are analyzed using either of the defect analysis methods of the first to ninth preferred embodiments.

For example, defect analysis can be performed for each lot by totaling the numbers of classified chips on a plurality of wafers within the lot. The analysis can be also performed for each processing batch unit with several lots tied to each other.

In a defect analysis method of the tenth preferred embodiment, chips are classified according to the presence or absence of a defect on a plurality of wafer and defective/ non-defective judgment. This achieves statistically highly reliable defect analysis.

When the number of chips in one group is extremely small in the fourfold classification of chips, for example, the defect analysis using only a single wafer shows low reliability. However, if a plurality of wafers are used for classification as described in the tenth preferred embodiment, the total number of chips to be analyzed is increased. This obviously increases statistical reliability.

10–2. Method

Only if the number of wafers to be analyzed is increased, each method of the first to ninth preferred embodiments can be adopted as it is to the tenth preferred embodiment.

11. Eleventh Preferred Embodiment

11–1. Principle

In the first to tenth preferred embodiments, chips are classified only according to the presence or absence of a defect. Thus, a chip with one defect and a chip with more than one defects are classified into the same group. According to an eleventh preferred embodiment, on the other hand, chips are classified according to the number of defects therein: for example, "chip with one defect"; "chip with two defects"; "chip with three defects or more", or the like. More specifically, in consideration of the number of defects, chips are classified into four groups according to the presence or absence of a defect and the defective/non-defective judgment as in the first preferred embodiment shown in FIG. 4, or into five groups one of which is not to be analyzed, as in the seventh preferred embodiment shown in FIG. 14.

After the chips are classified according to the presence or absence of a defect and the defective/non-defective judgment by a tester in consideration of the number of defects in a chip, the number of new defective chips N1, the critical rate RF, and the number of process defective chips NB are obtained as in the first preferred embodiment. This makes it possible to quantitatively recognize a reducible number of defective chips when an improvement is made in the defects of the specified process; the sensitivity of the inspection apparatus to inspect a defect of the specified process, and the influence of the defect of the specified process on the yield of the device.

Further, since the chips are classified on the basis of the number of defects therein in the defect analysis method of the eleventh preferred embodiment, the influence of a cluster, a collection of defects, on yield and the influence of normal defects on yield can be separately analyzed.

11–2. Method

The defect analysis method of the eleventh preferred embodiment is implementable through similar procedures to those of the first preferred embodiment shown in FIG. 6. However, the "new defect" at the steps S3 to S6, is substituted by a "new defect obtained in consideration of the number of defects". Further, when the method of the seventh preferred embodiment is concurrently used, S3 is a step of judging the presence or absence of a defect of a predetermined detection size having a specific distribution in each chip. In this way, only the corresponding parts of the procedures have to be changed when the methods of the other preferred embodiments are concurrently used.

12. Twelfth Preferred Embodiment

According to a twelfth preferred embodiment, a defect analysis method as described in the first to eleventh preferred embodiments is stored as a program in a storage medium such as a CDROM.

Figure 16:
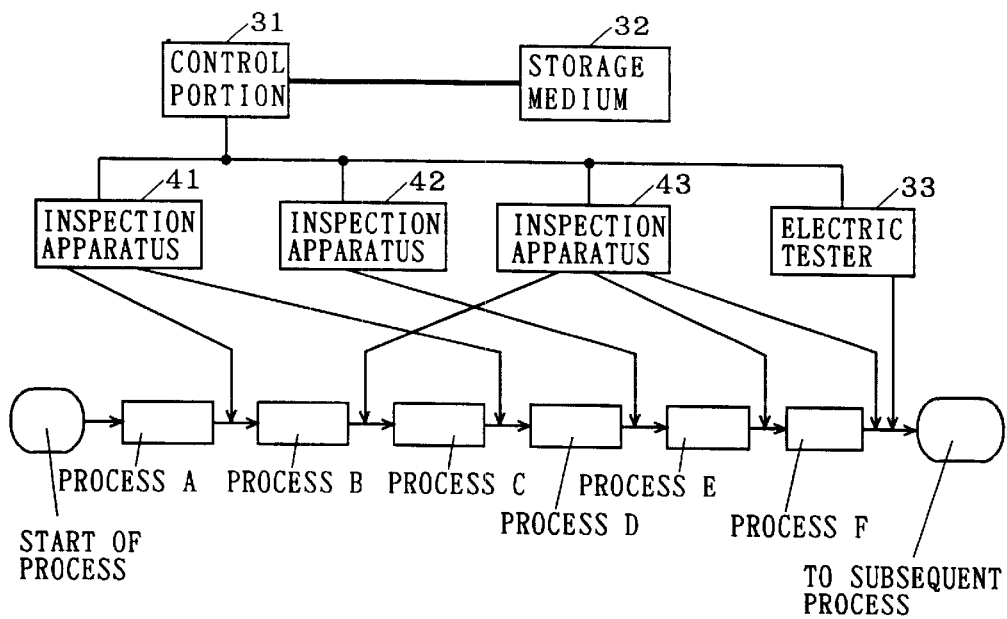
FIG. 16 shows a structure of a defect analysis system according to a twelfth preferred embodiment.

FIG. 16 is an illustration showing a first structure of a defect analysis system according to the twelfth preferred embodiment of the present invention. As shown in the drawing, a control portion 31 can read a defect analysis method from a storage medium 32, such as a CDROM, for storing at least one of the analysis methods of the first to eleventh preferred embodiments as a defect analysis program.

An inspection apparatus 41, on the other hand, performs defect detection right after each of the processes A and C. The apparatus 41 detects a position of coordinates of a defect on a wafer and the size of the defect, and outputs defect information to the control portion 31. Similarly, an inspection apparatus 42 outputs defect information obtained right after each of the processes A and D to the control portion 31, and an inspection apparatus 43 outputs defect information obtained right after each of the processes B, E and F to the control portion 31.

An electric tester 33 conducts an electric test on a device after the final process of the preliminary procedure, namely, the process F, is completed, and outputs defective/non-defective judgment information as a test result to the control portion 31. The process F is followed by a subsequent procedure including cutting of chips, bonding, resin sealing, or the like.

The control portion 31 then implements the defect analysis method which is read from the storage medium 32, on the basis of the defect information of each of the processes A to F obtained by the inspection apparatuses 41 to 43 and the defective/non-defective judgment information obtained by the electric tester 33.

When a defect analysis program stored in the storage medium 32 corresponds to the defect analysis method of the first preferred embodiment, the control portion 31 implements the method according to the procedures shown in FIG. 6. That is, the procedures of the steps S1 to S7 are performed under control of the control portion 31; especially the procedure of the step S1 is performed by an inspection apparatus; and the procedure of the step S2 is performed by an electric tester.

When the defect information consists of the coordinates and the size of the new defect of each process, S1 is a step of extracting a new defects on the basis of defect information.

When the control portion 31 has a function to obtain the coordinates of the new defect of each process on the basis of the defect information, S1 in the defect analysis program is a step of receiving coordinates of a new defect of each process from the control portion 31.

Figure 17:
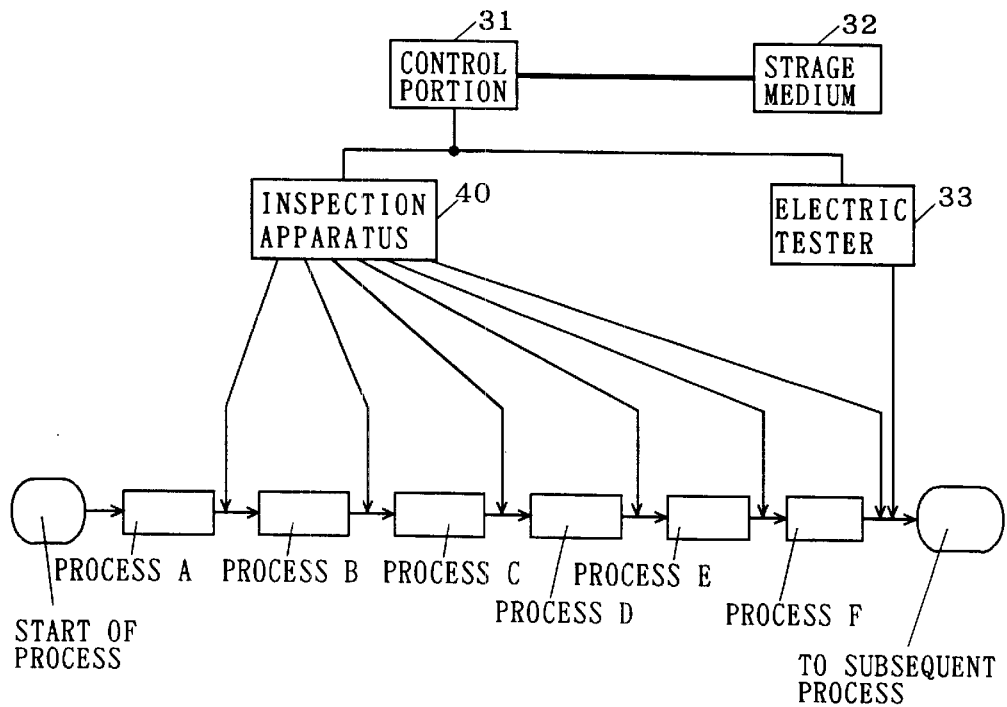
FIG. 17 shows another structure of the defect analysis system according to the twelfth preferred embodiment.

FIG. 17 is an illustration showing a second structure of the defect analysis system according to the twelfth preferred embodiment. As shown in the drawing, an inspection apparatus 40 detects a defect after each of the processes A to F, and outputs resultant defect information of each process together to the control portion 31. The other portions of the structure are similar to those of the first structure.

The defect detection of each process can be performed by either a plurality of inspection apparatuses as in the first structure or a single inspection apparatus as in the second structure.

According to the defect analysis system of the twelfth preferred embodiment, the defect analysis as described in the first through eleventh preferred embodiments can be performed automatically by previously storing the defect analysis methods of the first to eleventh preferred embodiments within the storage medium 32. This permits early effective measures to the manufacturing processes.

In the second structure, also, when the control portion 31 has a function to obtain the coordinates of the new defect of each process on the basis of the defect information, S1 in the defect analysis program is a step of receiving coordinates of a new defect of each process from the control portion 31.

Additionally, in the second structure, the inspection apparatus 40 itself (including the inspection apparatus 40 with a specialized data processing system) can have a function to obtain the coordinates of the new defect of each process on the basis of the defect information. In such case, S1 is a step of receiving coordinates of a new defect of each process from the inspection apparatus 40.

13. Improvement in Manufacturing Process

The manufacturing processes can be improved by using the analysis results obtained from the defect analysis methods of the first to eleventh preferred embodiments. For example, a manufacturing process which is ranked high in order of requiring improvement by the defect analysis method of the third preferred embodiment because of its high maximum number of process defective chips NBMAX, can be improved by increasing frequency of cleaning a manufacturing device to be used for that process.

In the process of manufacturing a semiconductor device, cleaning a manufacturing device is important in preventing a reduction in yield. However, cleaning nee ds to be suppressed to a minimum to reduce labor and to lower an operating rate of the device.

Therefore, especially the manufacturing device to be used for the process ranked high in order of requiring improvement is intensively cleaned on the basis of the analysis result of the defect analysis method of the third preferred embodiment. Such effective cleaning makes it possible to obtain a proper manufacturing line.

Further, we can previously obtain a method for inspecting dust in each manufacturing device, namely, a correlation between the analysis results of the defect analysis methods of the first to eleventh preferred embodiments, and the amount of dust obtained by passing a non-product wafer through the device or the amount of dust detected by a dust motor in a device tube. Accordingly, in the future, only from the past correlation therebetween without awaiting the aforementioned analysis results, it will become possible to detect and intensively improve a manufacturing device which has an influence on yield because of its increase in the amount of dust.

Further, a manufacturing device can be improved by other means instead of increasing the frequency of cleaning. At a process X using a vacuum device, for example, throughput of the process X can be deteriorated if more time is spent to increase or decrease atmospheric pressure within a chamber to prevent dust. However, when the analysis results of the defect analysis methods of the first to eleventh preferred embodiments show that too quick increase or decrease in atmospheric pressure within a chamber of the vacuum device has an influence on yield, spending more time at the process X can be considered fully worthwhile even at the cost of somewhat throughput.

Figure 18:
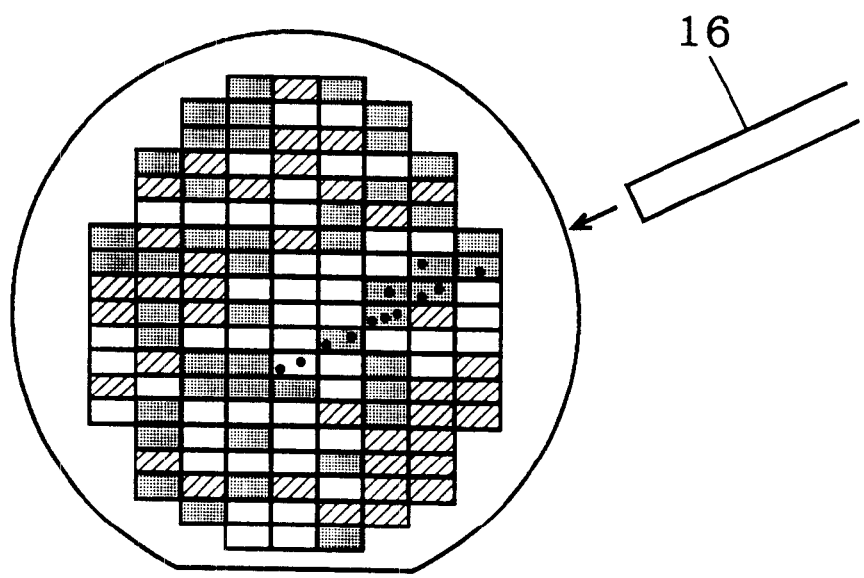
FIG. 18 illustrates a modification of the defect analysis method according to the seventh preferred embodiment.

Consider a case where a defect having a specific distribution is found at a process Y using a film formation device, and the defect is judged to have an influence on yield by the analysis method of the seventh preferred embodiment. If the defect distribution agrees with a locus of gas squirt from an exhaust nozzle 16 within a chamber as shown in FIG. 18, there is a high probability that the exhaust nozzle itself be the cause of the defect. In this case, an yield can be improved with high probability by modifying the exhaust nozzle of the film formation device used for the process Y.

As an efficient measure to improve the exhaust nozzle of the film formation device, cleaning of the exhaust nozzle is considered. The other measures include improvements in the film formation device itself, such as timing of gas squirting, control of squirt gas flow, a change in recipes, or a change in the position or the shape of the exhaust nozzle.

Further, when the defect having a specific distribution is determined to have an influence on yield at another process Z not Y, the cause of the defectiveness can be also limited to a contact of a robot arm handling a wafer, bad conditions of a wafer holding member, or the like. When the process Z uses a robot arm or a wafer holding member, it can be effectively improved by using the analysis results of the defect analysis method of the seventh preferred embodiment.

Further, even if the concrete cause of the defect cannot be easily specified, a manufacturing process can be improved on the basis of the analysis result of the first to eleventh preferred embodiments. When a dry-etching process is determined to have an influence on yield by the defect analysis method of the first to eleventh preferred embodiments, for example, a major consideration is given to the structure, quality of materials, recipe, and purity of the materials of a dry etching device to improve that process. This achieves a manufacturing line with high yield.

Further, the use of the defect analysis system of the twelfth preferred embodiment in implementation of the defect analysis methods of the first to eleventh preferred embodiments suppresses time for analysis, as compared to a manual method. It further makes it possible to obtain a statistically reliable analysis result from a large volume of data. Thus, the system is considerably efficient in improving the manufacturing processes.

14. Thirteenth Preferred Embodiment

14–1. Principle

In a thirteenth preferred embodiment, an analysis of the past is performed by classifying chips into four groups ① to ④ as shown in FIG. 4 on the basis of the presence or absence of a new defect in each chip and defective/nondefective judgement on each chip as in the first preferred embodiment. Then, a critical rate RF is obtained for each process.

After that, estimated yields BDA to BDF of new processes A to F for manufacturing a new device are calculated from the critical rates RF obtained through the past analysis and the number of new defects newly detected. Then, a total estimated yield of all the processes is calculated for process control.

14–2. Method

Figure 19:
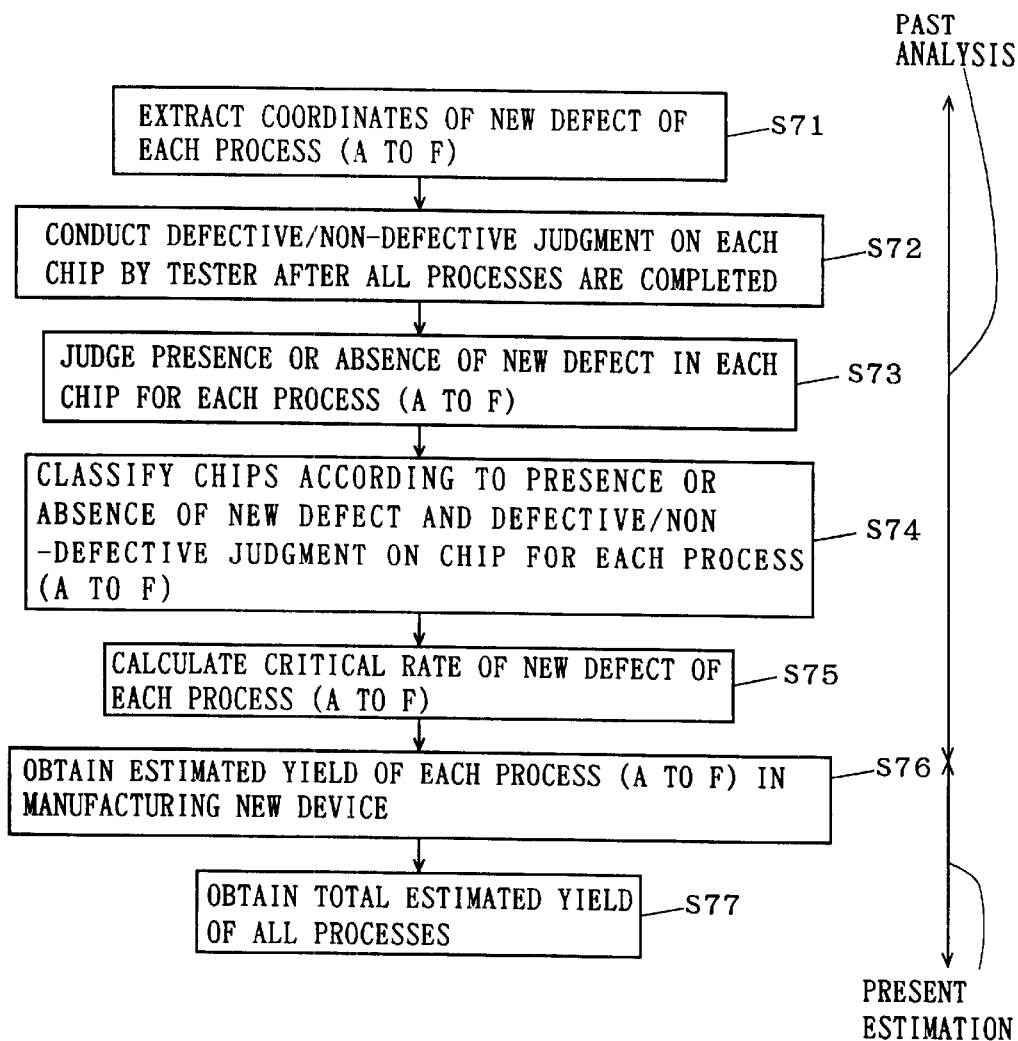
FIG. 19 is a flow chart showing the procedures of a method according to a thirteenth preferred embodiment.

FIG. 19 is a flow chart of a method for estimating an yield (process control method) according to the thirteenth preferred embodiment of the present invention. To be concrete, in this preferred embodiment, a similar device (integrated circuit) to that of the first preferred embodiment is manufactured through six processes A to F. After each of the processes A to F, an inspection apparatus performs a defect inspection. The procedures of this method will now be described.

Referring to FIG. 19, S71 is a step of extracting coordinates and a detection size of a new defect of each of the processes A to F by an inspection apparatus; S72 is a step of making a defective/non-defective judgement on each chip after all the processes by an electric tester; and S73 is a step of judging the presence or absence of a new defect in each chip for each of the processes A to F, on the identifying condition that any new defect is effective.

At a step S74, the new defect detected at the step S73 and the result of defective/non-defective judgment of the step S72 are compared on a wafer map for each of the processes A to F, by which the chips are classified into four groups ① to ④ as shown in FIG. 4 of the first preferred embodiment.

At a step S75, on the basis of the numbers of chips classified into four groups, a percent non-defective RG is calculated from a percent non-defective rg1 of the groups ① and ② (=①/(①+②)) and a percent non-defective rg3 of the groups ③ and ④ (=③/(③+④)) as shown in the equation (IV) of the first preferred embodiment. Then, a critical rate RF of a new defect of each of the processes A to F is obtained as shown in the equation (V) of the first preferred embodiment.

In this fashion, the critical rate RF of each of the processes A to F in manufacturing a predetermined device can be calculated from the results of the past analysis (steps S71 to S75). Then, present estimation is performed to estimate an yield in manufacturing a new predetermined device through the same processes A to F. We will now describe this present estimation.

S76 is a step of obtaining the estimated yields BDA to BDF of the processes A to F in manufacturing a new integrated circuit. The contents of the step is as follows:

First, like the step S71 of the past analysis, coordinates and a detection size of a new defect of each of new processes A to F are extracted by an inspection apparatus. Then, like the step S73 of the past analysis, the presence or absence of a new defect in each chip is judged for each of the processes A to F, on the identifying condition that any new defect is effective.

After that, an estimated yield of each process in manufacturing a new integrated circuit is obtained on the basis of the number of new defects newly detected and the critical rate RF obtained at the step S75 through the past analysis.

When the number of new defective chips NCD detected by an inspection apparatus at the process D is 48, for example, using the critical rate RF obtained at the step S75 (e.g. 62.5%), the number of process defective chips NBD of the process D is found by:

$$NBD = NCD \times RF = 30 \quad \text{(VII)}$$

Then, the estimated yield BDD of the process D is given by:

$$BDD = (AC - NBD)/AC = 0.778 \quad \text{(VIII)}$$

where AC is a total number of chips. In a similar way, the estimated yields BDA to BDC, BDE, and BDF of the other processes A to C, E, and F are obtained.

Last, at a step S77, a total estimated yield BDALL of all the processes is found by:

$$BDALL = BDA \cdot BDB \cdot BDC \cdot BDD \cdot BDE \cdot BDF \quad \text{(IX)}$$

In this yield estimation method of the thirteenth preferred embodiment, an yield in manufacturing a new device can be estimated with high accuracy, in consideration of the results of the past analysis (steps S71 to S75) and on the basis of new information, namely, the number of new defects of each process in progress.

15. Fourteenth Preferred Embodiment

15-1. Principal

In the aforementioned thirteenth preferred embodiment, the past analysis is performed by classifying chips into four groups ① to ④ as shown in FIG. 4 on the basis of the presence or absence of a new defect in each chip and the defective/non-defective judgement on each chip as in the first preferred embodiment. In this fourteenth preferred embodiment, this fourfold classification of chips is performed for each of a plurality of detection sizes of the new defect. Then, the critical rate RF is obtained for each detection size.

In the fourteenth preferred embodiment, new defects are classified into three kinds according to detection size: less than 1 $\mu$m; not less than 1 $\mu$m and less than 2 $\mu$m; and 2 $\mu$m or more. That is, three critical rates RF are obtained for each of the processes A to F. Accordingly, the estimated yields BDA to BDF of the processes A to F in manufacturing a new device are calculated from three possible numbers of new defective chips obtained for each detection size, and corresponding critical rates RF.

15-2. Method

The procedures of the past analysis are almost similar to the steps S71 to S75 shown in FIG. 19, but different in that the classification at the step S74 and the calculation of the critical rate at the step S75 are performed for each detection size of the new defect. We will describe this, taking, for example, the process D.

15-2-1. Step S74

Figure 20:
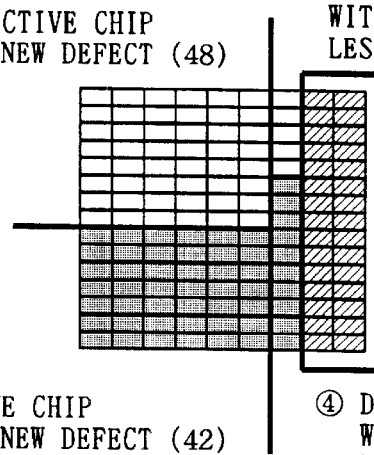
FIGS. 20 to 22 illustrate classifications of chips according to a fourteenth preferred embodiment.

When the detection size of the new defect is less than 1 $\mu$m, 135 chips are classified, as shown in FIG. 20, into five groups: ① non-defective chip with no new defect (48 chips); ② defective chip with no new defect (42 chips); ③ non-defective chip with new defect (5 chips); ④ defective chip with new defect (19 chips); and ⑤ chip with new defect out of a predetermined detection size (1 $\mu$m or more) (30 chips). Of these five groups, the groups ① to ④ are to be analyzed.

Figure 21:
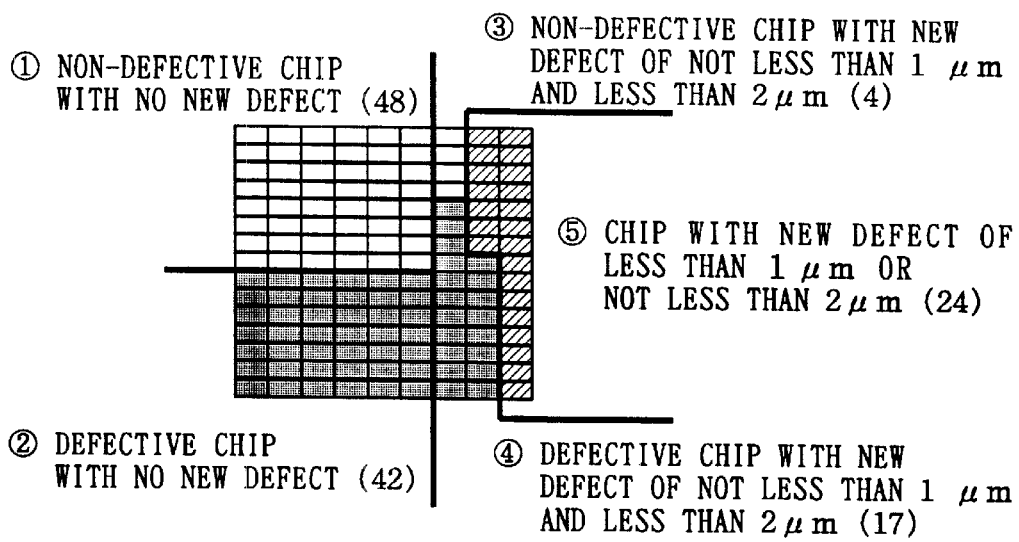

When the detection size of the new defect is not less than 1 $\mu$m and less than 2 $\mu$m, 135 chips are classified, as shown in FIG. 21, into five groups: ① non-defective chip with no new defect (48 chips); ② defective chip with no new defect (42 chips); ③ non-defective chip with new defect (4 chips); ④ defective chip with new defect (17 chips); and ⑤ chip with new defect out of a predetermined detection size (less than 1 $\mu$m, or 2 $\mu$m or more) (24 chips). Of these five groups, the groups ① to ④ are to be analyzed.

Figure 22:
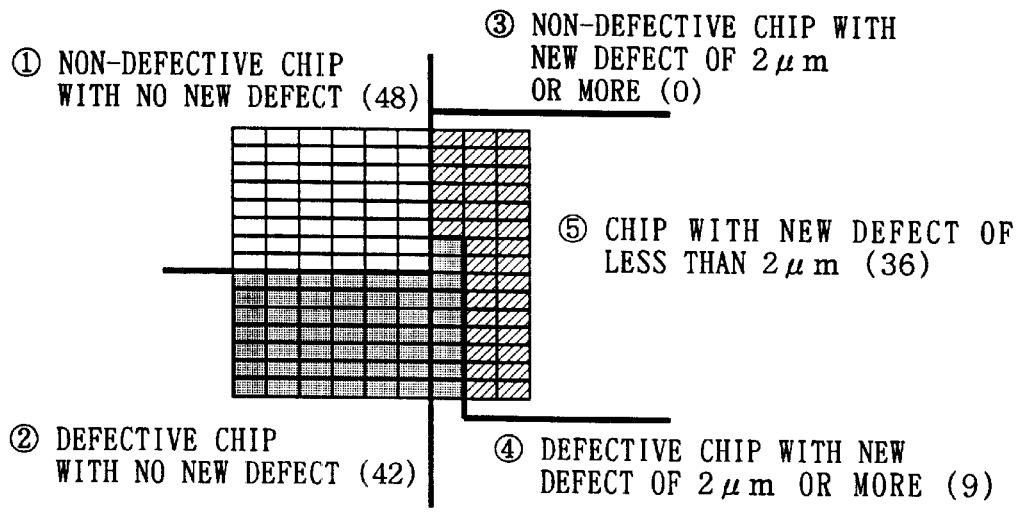
Figure 23:
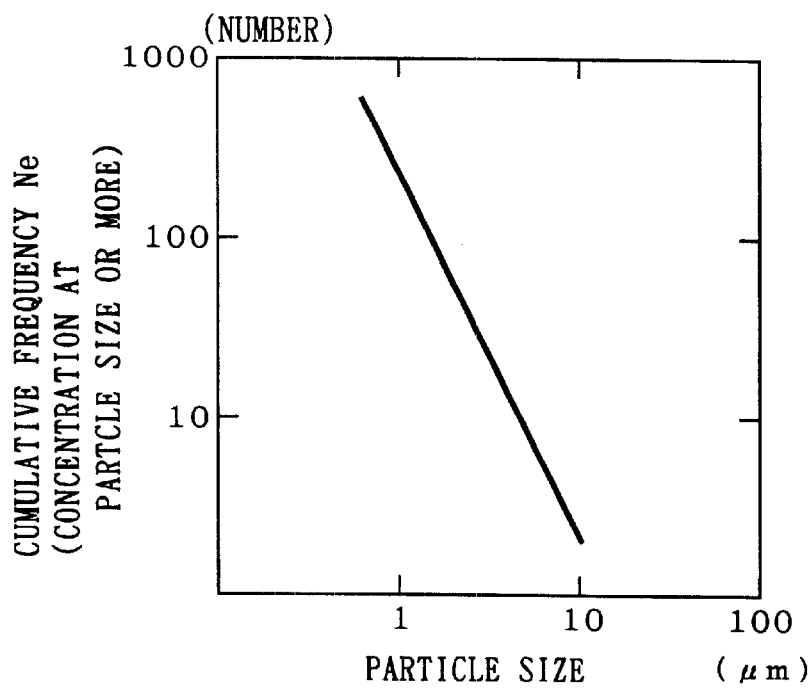
FIG. 23 is a graph showing a correlation between particle size and cumulative frequency.

When the detection size of the new defect is 2 $\mu$m or more, 135 chips are classified, as shown in FIG. 22, into five groups: ① non-defective chip with no new defect (48 chips); ② defective chip with no new defect (42 chips); ③ non-defective chip with new defect (none); ④ defective chip with new defect (9 chips); and ⑤ chip with new defect out of a predetermined detection size (less than 2 $\mu$m) (36 chips). Of these five groups, the groups ① to ④ are to be analyzed.

15-2-2. Step S75

When the detection size of the new defect is less than 1 $\mu$m (FIG. 20), the percent non-defective RG is calculated from the percent non-defective rg1 of the groups ① and ② (=①/(①+②)) and the percent non-defective rg3 of the group ③ and ④ (=③/(③+④)) as shown in the equation (IV). Then, as shown in the equation (V), a critical rate RF of the new defect of less than 1 $\mu$m is calculated from the percent non-defective RG, for each of the processes A to F. In FIG. 20, the critical rate RF equals 0.375.

When the detection size of the new defect is not less than 1 $\mu$m and less than 2 $\mu$m (FIG. 21), the percent non-defective RG is calculated from the percent non-defective rg1 of the groups ① and ② (=①/(①+②)) and the percent non-defective rg3 of the groups ③ and ④(=③/(③+④)) as shown in the equation (IV). Then, as shown in the equation (V), a critical rate RF of the new defect of not less than 1 μm and less than 2 μm is calculated from the percent non-defective RG, for each of the processes A to F. In FIG. 21, the critical rate RF equals 0.786, which is larger than that of the new defect of less than 1 μm.

When the detection size of the new defect is 2 μm or more (FIG. 22), the percent non-defective RG is calculated from the percent non-defective rg1 of the groups ① and ②(=①/(①=②)) and the percent non-defective rg3 of the groups ③ and ④(=③/(③+④)) as shown in the equation (IV). Then, as shown in the equation (V), a critical rate RF of the new defect of 2 μm or more is calculated from the percent non-defective RG, for each of the processes A to F. In FIG. 22, the critical rate RF equals 1.0 which is the absolute critical rate higher than that of the new defect of not less than 1 μm and less than 2 μm.

The procedures of the present estimation are almost similar to the steps S76 and S77 shown in FIG. 19, but different in the step S76 that the classification is performed and that the estimated yield of each process equals a total of values obtained for each detection size of a new defect. We will describe this, taking, for example, the process D.

15–2–3. Step S76

The number of new defective chips occurring at the process D in the manufacture of a new device is obtained for each of three detection sizes: less than 1 μm; not less than 1 μm and less than 2 μm; and 2 μm or more. When a single chip has two or more new defects, the chip is classified according to the detection size of the largest new defect.

When new defects of less than 1 μm are distributed among 23 chips, the number of defective chips due to those new defect equals 23×0.375=8.6. When new defects of not less than 1 μm and less than 2 μm are distributed among 10 chips, the number of defective chips due to those new defect equals 10×0.786=7.9. When new defects of 2 μm or more are distributed among 15 chips, the number of defective chips due to those new defect equals 15×1.0=15.

As a result, the number of process defective chips of the process D equals 8.6+7.9+15=31. Accordingly, the estimated yield BDD of the signal process D can be found by the equation (VIII).

In this yield estimation method of the fourteenth preferred embodiment, an estimated yield of each process is calculated from the critical rates RF obtained for three detection sizes. Thus, even if the particle size distribution of defects over a wafer during the past analysis is different from that during the present estimation, an yield can be estimated with high accuracy. For example, accurate estimation is possible even when the process D is a process of forming a film, and insufficient cleaning of an exhaust nozzle for material gas causes uniform-sized foreign particles of 3 μm or more.

Figure 24:
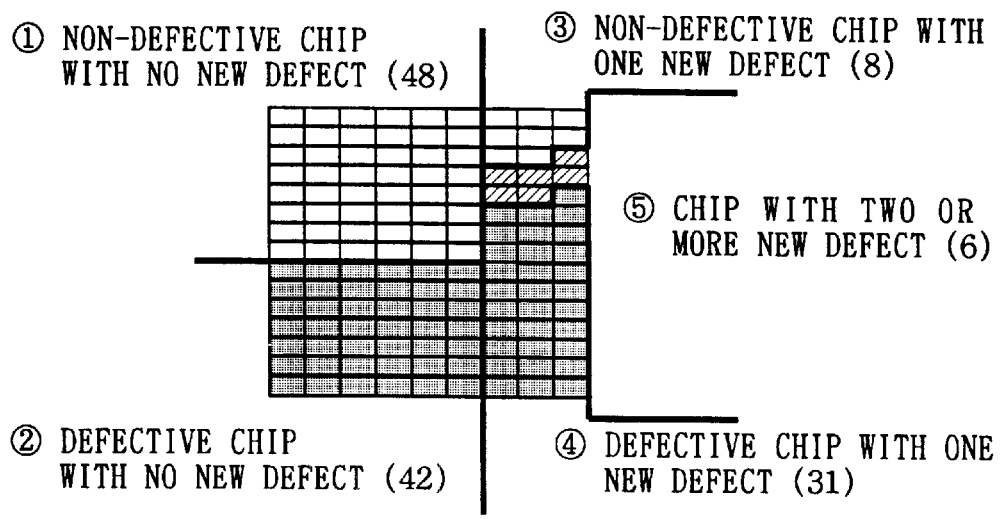
FIGS. 24 to 26 illustrate classifications of chips according to a fifteenth preferred embodiment.

According to Japan Industrial Standard (JIS) B9920, a correlation between particle size and cumulative frequency has been simply considered approximate to a relation of the power as shown in FIG. 24. In the fourteenth preferred embodiment, on the other hand, a critical rate is separately obtained for each detection size of the new defect. Thus, the method is applicable even in a case where a new defect, which is not approximate to the relation of the power as shown in FIG. 24, is generated on a wafer.

At the step S75 of the fourteenth preferred embodiment, a critical rate of a new defect of each detection size is calculated for each process on the basis of the results of the past analysis. That is, the value is obtained in consideration of the presence or absence of a new defect which may be small when detected but becomes so large as to break through upper and lower layers, or in consideration of a difference in the size of a new defect giving an influence on the device due to roughness of a device pattern of each layer. Thus, we can form a highly accurate yield estimation at the steps S76 and S77.

While three detection sizes of a new defect are defined by 1 μm in the fourteenth preferred embodiment, the detection size or the number of detection sizes can be varied.

In this fourteenth preferred embodiment, it is further found that a new defect of 2 μm or more is an absolute critical defect of the process D. The detection size, however, does not necessarily correspond to a measured value of an electron microscope or the like, as long as the order of size of the new defects is clear. That is, even if the new defects are classified roughly into three kinds: large; medium; and small, not by the continuous sizes as in the fourteenth preferred embodiment, an estimated yield can be calculated on the basis of the critical rates obtained for these three kinds.

16. Fifteenth Preferred Embodiment

16–1. Principal

In the aforementioned thirteenth preferred embodiment, the past analysis is carried out by classifying chips into four groups ① to ④ as shown in FIG. 4 according to the presence or absence of a new defect in each chip and the defective/non-defective judgement on the chip as in the first preferred embodiment. In this fifteenth preferred embodiment, this fourfold classification is performed for each of the numbers of new defects in a chip. Then, the critical rate RF is obtained for each of the numbers.

In the fifteenth preferred embodiment, new defects are classified into three kinds according to the number thereof in a chip: one; two; and three. That is, three critical rates RF are obtained for each of the processes A to F. Accordingly, the estimated yields BDA to BDF of the processes A to F in manufacturing a new device are calculated from three possible numbers of new defective chips, and corresponding critical rates RF.

16–2. Method

The procedures of the past analysis are almost similar to the steps S71 to S75 shown in FIG. 19, but different in that the classification at the step S74 and the calculation of the critical rate at the step S75 are performed for each of the numbers of new defects. We will describe this, taking, for example, the process D.

16–2–1. Step S74

When the number of new defects in a chip is one, 135 chips are classified, as shown in FIG. 24, into five groups: ① non-defective chip with no new defect (48 chips); ② defective chip with no new defect (42 chips); ③ non-defective chip with new defect (8 chips); ④ defective chip with new defect (31 chips); and ⑤ chip with an improper number of new defects (other than one) (6 chips). Of these five groups, the groups ① to ④ are to be analyzed.

Figure 25:
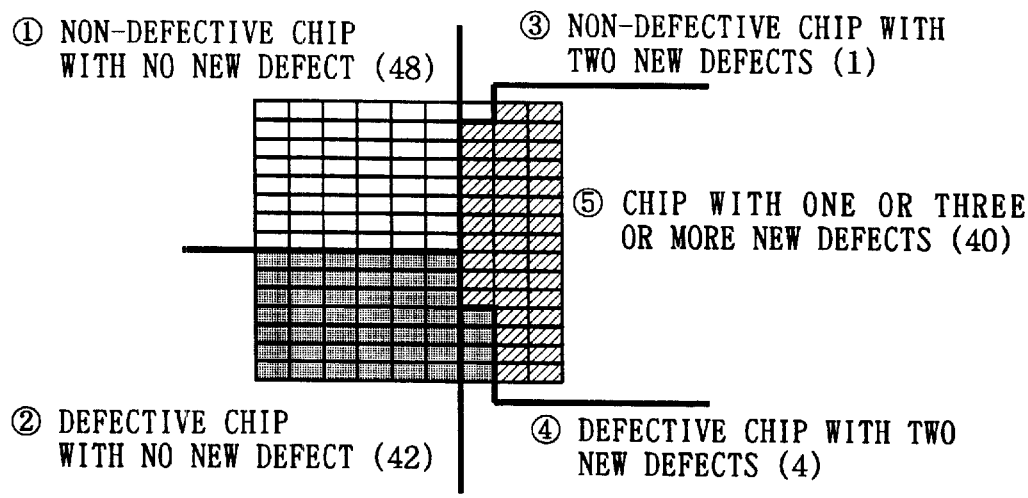

When the number of new defects in a chip is two, 135 chips are classified, as shown in FIG. 25, into five groups: ① non-defective chip with no new defect (48 chips); ② defective chip with no new defect (42 chips); ③ non-defective chip with new defect (1 chip); ④ defective chip with new defect (4 chips); and ⑤ chip with an improper number of new defects (other than two) (40 chips). Of these five groups, the groups ① to ④ are to be analyzed.

Figure 26:
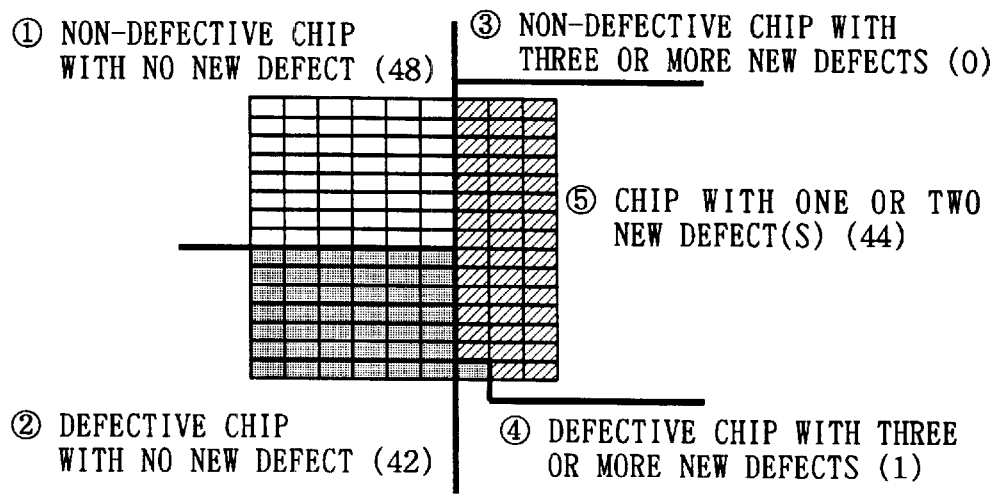
Figure 27:
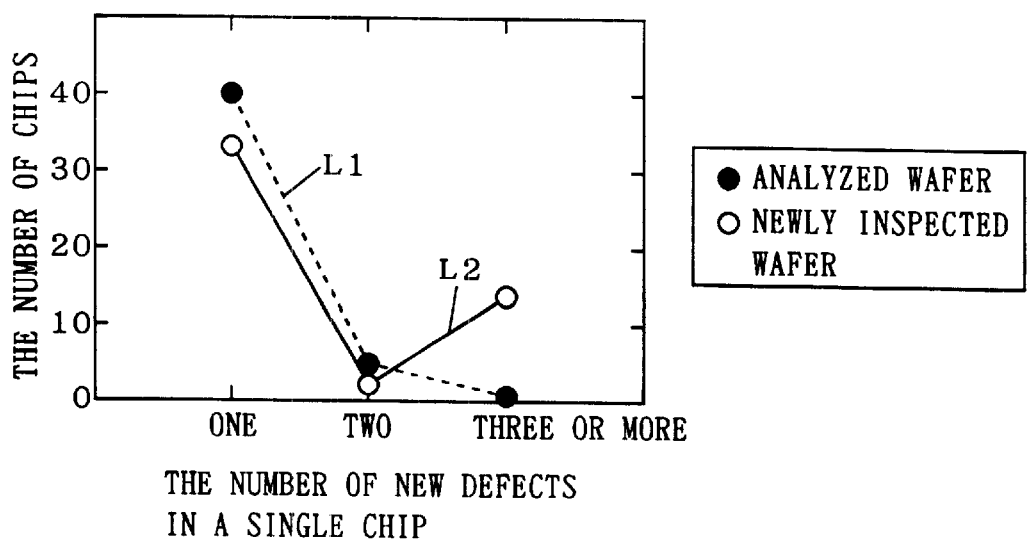
FIG. 27 is a graph showing a difference in aggregate distribution between an analyzed wafer and a newly inspected wafer.

When the number of new defects in a chip is three or more, 135 chips are classified, as shown in FIG. 26, into five groups: ① non-defective chip with no new defect (48 chips); ② defective chip with no new defect (42 chips); ③ non-defective chip with new defect (none); ④ defective chip with new defect (1 chip); and ⑤ chip with an improper number of new defects (other than three or more) (44 chips). Of these five groups, the groups ① to ④ are to be analyzed.

16–2–2. Step S75

When the number of new defects is one (FIG. 24), the percent non-defective RG is calculated from the percent non-defective rg1 of the groups ① and ②(=①/(①+②)) and the percent non-defective rg3 of the group ③ and ④ (=③/(③+④)) as shown in the equation (IV). Then, as shown in the equation (V), a critical rate RF of one new defect is calculated from the percent non-defective RG, for each of the processes A to F. In FIG. 24, the critical rate RF equals 0.615.

When the number of new defects is two (FIG. 25), the percent non-defective RG is calculated from the percent non-defective rg1 of the groups ① and ② (=①/(①+②)) and the percent non-defective rg3 of the groups ③ and ④ (=③/(③+④)) as shown in the equation (IV). Then, as shown in the equation (V), a critical rate RF of two new defects is calculated from the percent non-defective RG, for each of the processes A to F. In FIG. 25, the critical rate RF equals 0.625, which is higher than that of one new defect.

When the number of new defects is three or more (FIG. 26), the percent non-defective RG is calculated from the percent non-defective rg1 of the groups ① and ② (=①/(①+②)) and the percent non-defective rg3 of the groups ③ and ④ (=③/(③+④)) as shown in the equation (IV). Then, as shown in the equation (V), a critical rate RF of three new defects is calculated from the percent non-defective RG, for each of the processes A to F. In FIG. 26, the critical rate RF equals 1.0 which is an absolute critical rate higher than the critical rate RF of two new defects.

In this fashion, as the number of new defects in a chip increases, the critical rate RF increases. We will now consider the reasons. The defect inspection apparatus does not always cover 100% of a chip area to be inspected. Thus, some area may not be carefully inspected nor inspected at all. In such case, even if several new defects are caused in a single chip by a specific cause, all the new defects may not be detected.

On the other hand, a new defect can be or cannot be fatal depending on its position in a chip, because of roughness of a pattern and the number of redundant circuits. This applies to every new defect detected or not detected. That is, as the number of new defects detected in a chip increases, the probability that the chip includes more new defects to be fatal increases.

The procedures of the present estimation are almost similar to the steps S76 and S77 shown in FIG. 19, but different in the step S76 that classification is performed and that the estimated yield of each process equals a total of values obtained for the three numbers of new defects. We will describe this, taking, for example, the process D.

16–2–3. Step S76

The number of new defective chips occurring at the process D in the manufacture of a new device is obtained for each of three possible numbers of new defects in a chip: one; two; and three .

When the number of chips having one new defect is 33, the number of defective chips due to that new defect equals 33×0.615=20.3. When the number of chips having two new defects is 2, the number of defective chips due to those new defects equals 2×0.625=1.3. When the number of chips having three new defects is 13, the number of defective chips due to those new defects equals 13×1.0=13.

As a result, the number of process defective chips of the process D equals 20.3 +1.3+13=34.6. Accordingly, the estimated yield BDD of the process D can be found by the equation (VIII).

In this yield estimation method of the fifteenth preferred embodiment, an estimated yield of each process is calculated from the critical rates RF obtained for the respective numbers of new defects. Thus, even if an aggregate distribution (L1) of defects over a wafer during the past analysis is different from that (L2) during the present estimation, an yield can be estimated with high accuracy. For example, accurate estimation is possible even when the process D is a process of forming a film, and insufficient cleaning of an exhaust nozzle for material gas intensively causes foreign particles on chips in the vicinity of the exhaust nozzle.

If new defects are considered to be simply distributed at random, accuracy of the estimated yields is reduced. In the fifteenth preferred embodiment, however, the critical rate RF is obtained for each of the numbers of new defects in a chip. Thus, the method is applicable even in a case where the actual aggregate distribution over a wafer is different from that during the analysis; for example, foreign particles are converged on certain chips.

While new defects are classified into three kinds according to the number thereof in a chip in the fifteenth preferred embodiment, they can be classified into more kinds. However, the maximum of existing number of new defects in a chip should be about 10. For example, consider when there are 100 chips in a single wafer and 500 new defects are distributed at random. When new defects are classified into ten kinds: from one to ten, according to the number thereof in a chip, 98% of chips are covered by this. When new defects are classified into eleven kinds: from one to eleven in the same way, 99% of chips are covered by this. Thus, as a matter of practicality, about 10 kinds are enough for classification.

When a single chip includes more than 10 new defects, the chip can be considered in most cases to have a specific distribution due to a specific cause. Thus, it should be sufficient to classify such a chip into a group: "more than the maximum of existing number of new defects". By setting the maximum number within a sufficient range of accuracy for practical use, the past analysis and the present estimation can be simplified.

17. Sixteenth Preferred Embodiment

17–1. Principal

In the aforementioned thirteenth preferred embodiment, the past analysis is carried out by classifying chips into four groups ① to ④ as shown in FIG. 4 according to the presence or absence of a new defect in each chip and the defective/non-defective judgement on each chip as in the first preferred embodiment. In this sixteenth preferred embodiment, this fourfold classification is performed for each specific distribution of a new defect in a chip. Then, the critical rate RF is obtained for each specific distribution.

Figure 28:
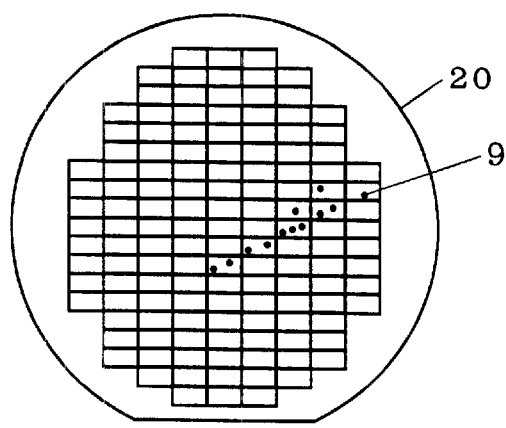
FIG. 28 illustrates a specific distribution of new defects.

In the sixteenth preferred embodiment, new defects are classified into two kinds: a new defect 9 having a specific distribution over a wafer 20 as shown in FIG. 28; and a new defect having no specific distribution. That is, two critical rates RF are obtained for each of the processes A to F. Accordingly, the estimated yields BDA to BDF of the processes A to F in manufacturing a new device are calculated from two possible numbers of new defective chips, and corresponding critical rates RF.

17–2. Method

The procedures of the past analysis are almost similar to the steps S71 to S75 shown in FIG. 19, but different in that the classification at the step S74 and the calculation of the critical rate at the step S75 are performed for each kind: new defect having a specific distribution and new defect having no specific distribution. We will describe this, taking, for example, the process D.

17-2-1. Step S74

For a new defect having a specific distribution, 135 chips are classified into five groups: ① non-defective chip with no new defect; ② defective chip with no new defect; ③ non-defective chip with new defect; ④ defective chip with new defect; and ⑤ chip with new defect having no specific distribution. Of these five groups, the groups ① to ④ are to be analyzed.

For a new defect having no specific distribution, 135 chips are classified into five groups: ① non-defective chip with no new defect; ② defective chip with no new defect; ③ non-defective chip with new defect; ④ defective chip with new defect; and ⑤ chip with new defect having a specific distribution. Of these five groups, the groups ① to ④ are to be analyzed.

17-2-2. Step S75

For a new defect having a specific distribution, the critical rate RF is calculated from the percent non-defective RG as shown in the equation (V), for each of the processes A to F.

For a new defect having no specific distribution, the critical rate RF is calculated from the percent non-defective RG as shown in the equation (V), for each of the processes A to F.

The procedures of the present estimation are almost similar to the steps S76 and S77 shown in FIG. 19, but different in the step S76 that calculation is performed and that the estimated yield of each process equals a total of values obtained for each kind: new defect having a specific distribution and new defect having no specific distribution. We will describe this, taking, for example, the process D.

17-2-3. Step S76

The number of new defective chips occurring at the process D in the manufacture of a new device is obtained for each kind: new defect having a specific distribution and new defect having no specific distribution.

The number of defective chips due to a new defect having a specific distribution is obtained by multiplying the number of new defects having a specific distribution by a corresponding critical rate. The number of defective chips due to a new defect having no specific distribution is obtained by multiplying the number of new defects having no specific distribution by a corresponding critical rate.

As a result, the number of process defective chips of the process D is obtained by adding those numbers of defective chips. Accordingly, the estimated yield BDD of the process D can be found by the equation (VIII).

In this yield estimation method of the sixteenth preferred embodiment, an estimated yield of each process is calculated from the critical rate RF of a new defect having a specific distribution and from the critical rate RF of a new defect having no specific distribution. Thus, even if a specific distribution over a wafer during the past analysis is different from that during the present estimation, an yield can be estimated with high accuracy.

While only one kind of specific distribution is shown in the sixteenth preferred embodiment, it is also possible to use several kinds of specific distribution. When there are three kinds of specific distribution, for example, new defects are classified into four kinds: three kinds each having a different specific distribution; and one kind having no specific distribution. Then, the analysis of the critical rate, and the estimation of the number of defective chips are performed for each kind.

18. Seventeenth Preferred Embodiment 18-1. Principal

In the aforementioned thirteenth preferred embodiment, the past analysis is performed by classifying chips into four groups ① to ④ as shown in FIG. 4 according to the presence or absence of a new defect in each chip and the defective/non-defective judgement on each chip as in the first preferred embodiment. In this seventeenth preferred embodiment, this fourfold classification is performed for each shape of a new defect in a chip. Then, the critical rate RF is obtained for each of the shapes.

The shape of a new defect can be observed under a light-optic microscope or an electron microscope. It includes a pattern defect, a particle, adhesion of contaminants (stains), damage, or the like.

In the seventeenth preferred embodiment, new defects are classified into two kinds: new defect having a specific shape; and new defect having no specific shape. That is, two critical rates RF are obtained for each of the processes A to F. Accordingly, the estimated yields BDA to BDF of the processes A to F in manufacturing a new device are calculated from two possible numbers of new defective chips, and corresponding critical rates RF.

18-2. Method

The procedures of the past analysis are almost similar to the steps S71 to S75 shown in FIG. 19, but different in that the classification at the step S74 and the calculation of the critical rate at the step S75 are performed for each kind: new defect having a specific shape and new defect having no specific shape. We will describe this, taking, for example, the process D.

18-2-1. Step S74

For a new defect having a specific shape, 135 chips are classified into five groups: ① non-defective chip with no new defect; ② defective chip with no new defect; ③ non-defective chip with new defect; ④ defective chip with new defect; and ⑤ chip with new defect having no specific shape. Of these five groups, the groups ① to ④ are to be analyzed.

For a new defect having no specific shape, 135 chips are classified into five groups: ① non-defective chip with no new defect; ② defective chip with no new defect; ③ non-defective chip with new defect; ④ defective chip with new defect; and ⑤ chip with new defect having a specific shape. Of these five groups, the groups ① to ④ are to be analyzed.

18-2-2. Step S75

For a new defect having a specific shape, the critical rate RF is calculated from the percent non-defective RG as shown in the equation (V), for each of the processes A to F.

For a new defect having no specific shape, the critical rate RF is calculated from the percent non-defective RG as shown in the equation (V), for each of the processes A to F.

The procedures of the present estimation are almost similar to the steps S76 and S77 shown in FIG. 19, but different in the step S76 that classification is performed and that the estimated yield of each process equals a total of values obtained for each kind:

new defect having a specific shape and new defect having no specific shape. We will describe this, taking, for example, the process D.

18-2-3. Step S76

The number of new defective chips occurring at the process D in the manufacture of a new device is obtained for each kind: new defect having a specific shape and new defect having no specific shape.

The number of defective chips due to the new defect having a specific shape is obtained by multiplying the number of chips with new defect having a specific shape by a corresponding critical rate. The number of defective chips due to the new defect having no specific shape is obtained by multiplying the number of chips with new defect having no specific shape by a corresponding critical rate.

As a result, the number of process defective chips of the process D is obtained by adding those numbers of defective chips. Accordingly, the estimated yield BDD of the process D can be found by the equation (VIII).

There are several types of defects to be the cause of a specific shape: a pattern defect, a particle, adhesion of contaminants (stains), damage, or the like. The pattern defect includes short (two wires or layers to be generally isolated are short-circuited), breaking of wire (wires or layers to be generally connected are disconnected), abnormality in shape (the shape of a pattern is abnormal), or the like. A probable cause of the short or the breaking of wire is, for example, patterning with a particle used as a mask. The particle is considered to include an adhered particle, etching residual, or the like. An example of the adhesion of contaminants is adhesion of contaminants in a wet tub. The damage can occur, for example, when a handling error makes a scratch on a wafer.

These defects cause a new defect having a specific shape. That is, a new defect having a specific shape is often closely related to defectiveness of a chip. In this yield estimation method of the seventeenth preferred embodiment, an estimated yield of each process is calculated from the critical rates RF obtained for the new defect having a specific shape and the new defect having no specific shape. This increases accuracy in yield estimation.

While only one kind of specific shape is shown in the seventeenth preferred embodiment, it is also possible to use several kinds of specific shapes. When there are three kinds of specific shapes, for example, new defects are classified into four kinds: three kinds each having a different specific shape; and one kind having no specific shape. Then, the analysis of the critical rate and the estimation of the number of defective chips are performed for each kind.

19. Eighteenth Preferred Embodiment

19–1. Principal

In the aforementioned thirteenth preferred embodiment, the past analysis is performed by classifying chips into four groups ① to ④ as shown in FIG. 4 according to the presence or absence of a new defect in each chip and the defective/non-defective judgement on each chip as in the first preferred embodiment. In this eighteenth preferred embodiment, this fourfold classification is performed for each combination of at least two of the following: the detection size of a new defect, the number of new defects, the presence or absence of a new defect having a specific distribution, and the presence or absence of a new defect having a specific shape. Then, the critical rate RF is obtained for each combination.

In the eighteenth preferred embodiment, new defects are classified into 44 kinds according to the detection size (4 kinds) and the number thereof in a chip (11 kinds) as shown in Table 2 That is, 44 critical rates RF are obtained for each of the processes A to F. Accordingly, the estimated yields BDA to BDF of the processes A to F in manufacturing a new device are calculated from 44 possible numbers of new defective chips, and corresponding critical rates RF.

TABLE 2

| | Critical Rate | | | |
| --- | --- | --- | --- | --- |
| | | Detection Size | | |
| The number of New Defects in Chip | <1 μm | 1 μm ≤ <2 μm | 2 μm ≤ <3 μm | 3 μm ≤ |
| 1 | 0.156 | 0.325 | 0.684 | 0.897 |
| 2 | 0.311 | 0.436 | 0.853 | 0.951 |
| 3 | 0.560 | 0.589 | 0.950 | 1.0 |
| 4 | 0.628 | 0.736 | 1.0 | 1.0 |
| 5 | 0.789 | Unknown | Unknown | Unknown |
| 6 | Unknown | 0.812 | Unknown | Unknown |
| 7 | Unknown | 0.858 | Unknown | 1.0 |
| 8 | 0.854 | 0.922 | 1.0 | 1.0 |
| 9 | Unknown | 1.0 | Unknown | 1.0 |
| 10 | Unknown | Unknown | Unknown | Unknown |
| 11 or more | Unknown | Unknown | Unknown | 1.0 |

19–2. Method

The procedures of the past analysis are almost similar to the steps S71 to S75 shown in FIG. 19, but different in that the classification at the step S74 and the calculation of the critical rate at the step S75 are performed for each combination group. We will describe this, taking, for example, the process D.

19–2–1. Step S74

For each combination group, chips are classified into five groups: ① non-defective chip with no new defect; ② defective chip with no new defect; ③ non-defective chip with new defect; ④ defective chip with new defect; and ⑤ chip with new defect out of the conditions. Of these five groups, the groups ① to ④ are to be analyzed.

19–2–2. Step S75

Then, the critical rate RF for each combination is calculated from the percent non-defective RG as shown in the equation (V), for each of the processes A to F. In Table 2, "unknown" indicates that the critical rate cannot be calculated because there is no new defect concerned.

The procedures of the present estimation are almost similar to the steps S76 and S77 shown in FIG. 19, but different in the step S76 that classification is performed and that the estimated yield of each process equals a total of values obtained for each combination. We will describe this, taking, for example, the process D.

19–2–3. Step S76

The number of new defective chips occurring at the process D in the manufacture of a new device is obtained for each combination group shown in Table 2. When a single chip includes two or more new defects, the detection size of the largest new defect is used for classification. Alternatively, such a chip can be classified according to the detection size determined on a predetermined condition.

The number of defective chips for each combination is obtained by multiplying the number of chips with new defect for each combination by a corresponding critical rate.

As a result, the number of process defective chips of the process D is obtained by adding all the numbers of defective chips for each combination. Accordingly, the estimated yield BDD of the process D can be found by the equation (VIII).

In this yield estimation method of the eighteenth preferred embodiment, an estimated yield of each process is calculated from the critical rates RF obtained for each combination which is determined by combining various conditions such as the detection size of a new defect, the number of new defects, the presence or absence of a new defect having a specific distribution, and the presence or absence of a new defect having a specific shape. Thus, even if various conditions of the wafer during the past analysis are different from those during the present estimation, an yield can be estimated with considerably high accuracy.

20. Nineteenth Preferred Embodiment

20–1. Principal

While the data for the past analysis is only a new defect on a single wafer in the thirteenth to eighteenth preferred embodiments, the past analysis in this nineteenth preferred embodiment is performed on new defects on a plurality of wafers, using either of the methods of the thirteenth to eighteenth preferred embodiments.

For example, the past analysis is performed for each lot, using every chip on a plurality of wafers within a lot. Alternatively, the analysis can be performed for each processing batch which bundles several lots together. In both cases, the same result is obtained.

In this yield estimation method of the nineteenth preferred embodiment, as described above, the past analysis is performed by classifying chips on a plurality of wafers according to the presence or absence of new defects in each chip and the defective/non-defective judgement on each chip. Thus, an yield can be estimated with high accuracy on the basis of statistically highly reliable analysis results.

For example, when any one group out of the classified four groups to be analyzed has an extremely small number of chips, the defect analysis using only a single wafer shows low reliability. The method of the nineteenth preferred embodiment which performs a defect analysis of a plurality of wafers, on the other hand, increases a total number of chips to be analyzed in one defect analysis. This obviously increases statistic reliability of the analysis.

This nineteenth preferred embodiment is especially effective when there is a large number of items by which new defects are classified as in the eighteenth preferred embodiment. At this time, a plurality of wafers to be used for the past analysis do not necessarily have a similar particle size distribution or a similar aggregate distribution.

20–2. Method

The nineteenth preferred embodiment can adopt the methods of the thirteenth to eighteenth preferred embodiments as they are, except that the number of wafers to be used for the past analysis is increased.

21. Twentieth Preferred embodiment

21–1. Principal

In a twentieth preferred embodiment, when the past analysis shows that a new defect of less than 0.5 $\mu$m has no influence on yield, for example, a chip with new defect of less than 0.5 $\mu$m is regarded as a chip with no new defect, and such a chip is re-classified into either the groups ① or ② shown in FIG. 4 for re-analysis.

In this yield estimation method of the twentieth preferred embodiment, the past analysis is performed by classifying chips according to the presence or absence of a new defect in each chip on a wafer and the defective/non-defective judgement on each chip while judging the presence or absence of a new defect according to the influence on yield. Thus, an yield can be estimated with high accuracy on the basis of statistically highly reliable analysis results.

The twentieth preferred embodiment can adopt the methods of the thirteenth to eighteenth preferred embodiment as they are, except that re-analysis is performed on the basis of the influence on yield.

22. Twenty-first Preferred Embodiment

22–1. Principal

While the purpose of the aforementioned thirteenth to twentieth preferred embodiments is to calculate a total estimated yield of all the process, the prime purpose of this twenty-first preferred embodiment is to make a use of the yield estimation results obtained in the middle of the procedure.

Before the defect inspections of the processes A to F are completed, the number of process defective chips NB of the process D is, for example, estimated during the defect inspection of the process D. Then, the estimated value is utilized for the control of a semiconductor manufacturing device used at the process D.

Conventionally, a defect inspection of a product has been performed to detect an abnormality of a semiconductor manufacturing device by the number of defects in the product. This is, however, impractical because a device can be misjudged as abnormal when the number of small defects having little influence on yield increases, or because an important defect with a high critical rate (having a large influence on yield) can be overlook when the total number of defects including such a defect is less than a predetermined criteria.

In the aforementioned yield estimation methods of the thirteenth to twentieth preferred embodiments, on the other hand, the critical rate RF of each process is obtained through the past analysis based on the presence or absence of a new defect in each chip and the defective/non-defective judgement on each chip, and the estimated yield of each process is calculated from that critical rate RF and the number of new defects newly detected at that process. This increases accuracy in yield estimation.

Accordingly, there occurs no deterioration in yield of a semiconductor product due to overlook abnormality or in availability of a manufacturing device due to unnecessary cleaning according to the misjudgment of the device.

On the other hand, the calculation of a total yield of the processes A to D makes it possible to decide an omission of a wafer from which an economically sufficient yield cannot be expected even through the subsequent processes, or to decide an omission of lots when a sufficient yield cannot be expected from all the lots. Further, the number of non-defective chips can be expected to some extent before all the processes are completed. This allows an accurate adjustment of the number of wafers to be newly introduced to maintain a delivery date and the number of necessary shipments.

22–2. Method

Figure 29:
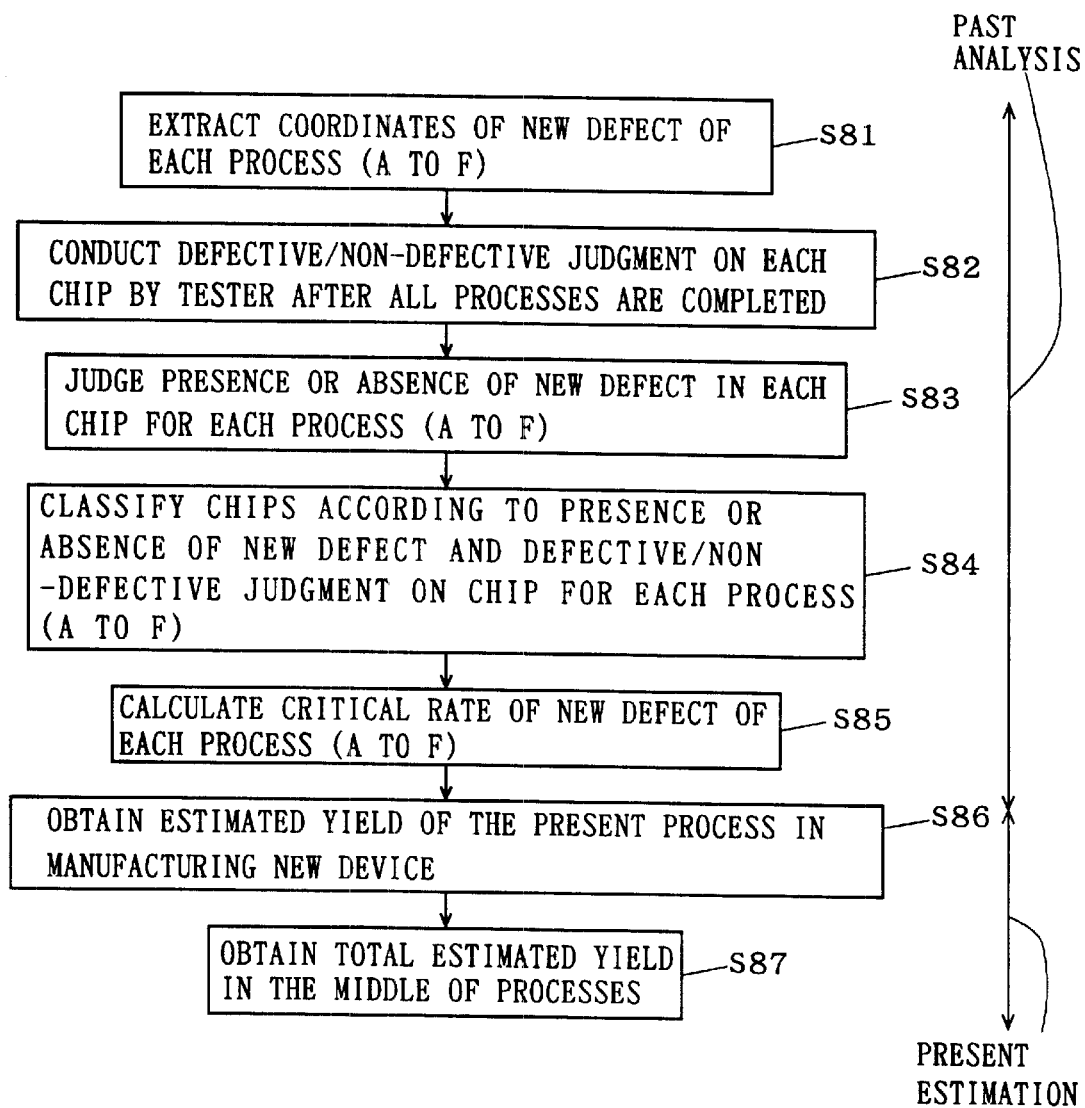
FIG. 29 is a flow chart showing the procedures of a method according to a twenty-first preferred embodiment.

FIG. 29 is a flow chart of a method for estimating an yield according to the twenty-first preferred embodiment of the present invention. To be concrete, in this preferred embodiment, a similar device (integrated circuit) to that of the first preferred embodiment is manufactured through the six processes A to F. After each of the processes A to F, an inspection apparatus performs a defect inspection. The procedures of this method will now be now described.

Steps S81 to S85 of the past analysis are identical to the steps S71 to S75 shown in FIG. 19.

Each critical rate RF of the processes A to F in the manufacture of a predetermined device can be obtained on the basis of the results of the past analysis through the steps S81 to S85. After that, a new predetermined device is manufactured through the identical processes A to F, which will be described below.

First, at a step S86, an estimated yield of the present process in the manufacture of a new integrated circuit is obtained. Using the process D as the present process, for example, the estimated yield BDD of the single process D is obtained on the basis of the new-defect detection result obtained from an inspection apparatus of the process D.

When the estimated yield BDD of the process D is not more than a predetermined reference value, the manufacturing device of the process D is judged as being in an abnormal condition.

Last, at a step S87, a middle estimated yield BDMID from the first process to the present process is obtained. Using the process D as the present process, for example, BDMID= BDA·BDB·BDC·BDD.

When the middle estimated yield BDMID is not more than a predetermined minimum reference value, it is judged that an economically sufficient yield cannot be expected from the processes E and F.

In this yield estimation method of the twenty-first preferred embodiment, the middle yield in the manufacture of a device is estimated on the basis of the detection result of a new defect of an on-going process (up-to-date information) in consideration of the results of the past analysis (steps S81 to S85). This allows effective running of a manufacturing line in operation.

23. Twenty-second Preferred Embodiment

23–1. Principal

While the thirteenth preferred embodiment has adopted the calculated total estimated yield of all the processes as it is, in this twenty-second preferred embodiment, the estimated yield is corrected according to the result of the past analysis of the estimated yield and the actual yield.

Figure 30:
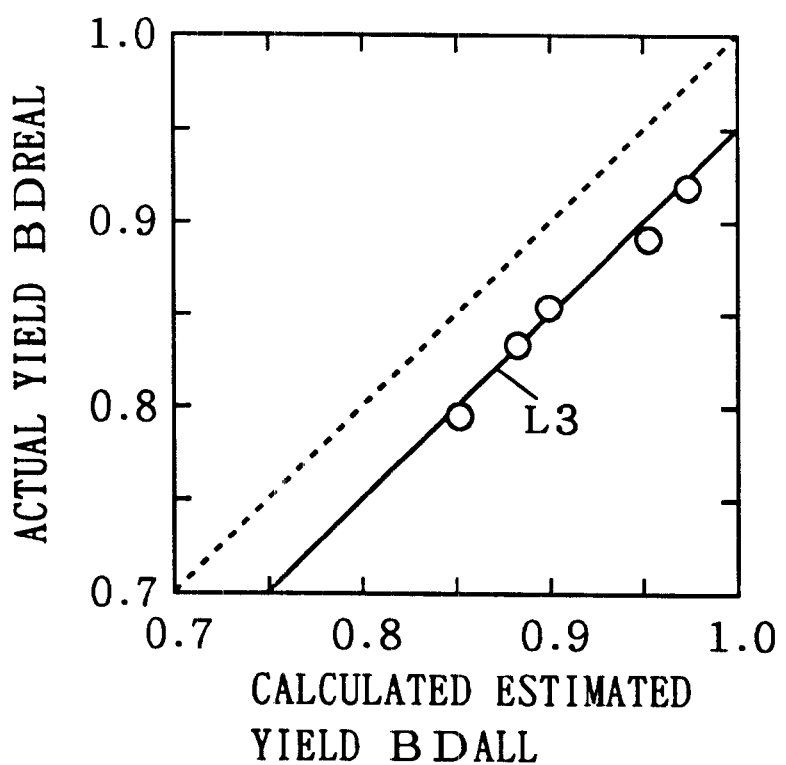
FIG. 30 is a graph showing a correlation between an estimated yield and an actual yield.

FIG. 30 is a graph showing a correlation between the actual yield BDREAL of five wafers that have been made in the past and the total estimated yield BDALL of all the processes that is obtained by the method of the thirteenth preferred embodiment. As shown with a line L3, the actual yield BDREAL and the total estimated yield BDALL do not agree with each other.

The reason is, for example, that an inspection apparatus does not always detect every factor in yield deterioration, or that the assumption of an uniform distribution of chips does not completely agree with the actual distribution.

With consideration given to this, a newly detected total estimated yield BDALL is corrected on the basis of the past analysis of the actual yield BDREAL and the total estimated yield BDALL. When the relation between the actual yield BDREAL and the estimated yield BDALL are as shown in FIG. 30, a corrected estimated yield CBDALL is found by:

$$CBDALL = BDALL - 0.05 \qquad (X)$$

23–2. Method

The processes of the past analysis are identical to the steps S71 to S75 shown in FIG. 19. The processes of the present estimation are almost identical to the steps S76 and S77 shown in FIG. 19, but different in the step S77 that the total estimated yield BDALL is substituted by the corrected estimated yield CBDALL.

In this yield estimation method of the twenty-second preferred embodiment, a corrected total estimated yield of all the processes in the manufacture of a device is calculated on the basis of the past comparison between the total estimated yield BDALL and the actual yield BDREAL. This increases accuracy in yield estimation.

While the estimated yield BDALL is calculated by the method of the thirteenth preferred embodiment in the twenty-second preferred embodiment, it is obvious that either of the methods of the fourteenth to twentieth preferred embodiments can be adopted.

24. Twenty-third Preferred Embodiment

In this twenty-third preferred embodiment, an yield estimation method as described in the thirteenth to twenty-second preferred embodiment is stored and executed as a program in a recording medium such as CDROM.

The structures shown in FIGS. 16 and 17 are considered as a structure of a defect analysis system of the twenty-third preferred embodiment. In FIG. 16, the control portion 31 can read a defect analysis method from the recording medium 32 such as a CDROM. The recording medium 32 stores at least one of the estimation methods of the thirteenth to twenty-second preferred embodiment as an yield estimation program.

The control portion 31 performs the past analysis of the yield estimation program which is read from the recording medium 32, on the basis of past defect information of the processes A to F obtained from the inspection apparatuses 41 to 43 and defective/non-defective judgement information obtained from the electric tester 33. The control portion 31 further performs the present estimation of the yield estimation program on the basis of the defect information of the processes A to F in progress which is obtained from the inspection apparatuses 41 to 43.

When the yield estimation program stored in the recording medium 32 is the yield estimation method of the thirteenth preferred embodiment, for example, the control portion 31 performs the processes in a similar way to the thirteenth preferred embodiment shown in FIG. 19. More specifically, the steps S71 to S77 are performed under control of the control portion 31. Especially, the step S71 is performed by an inspection apparatus; and the step S72 is performed by an electric tester.

In the process of extracting coordinates of a new defect at the step S71, when the defect information includes a coordinate position of a defect of each process and a detection size, coordinates of a new defect of each process is obtained on the basis of the defect information.

When the control portion 31 has a function to obtain the coordinates of a new defect of each process on the basis of the defect information, the step S71 in the yield estimation program is a process of inputting the coordinates of a new defect of each process from the control portion 31.

In this defect analysis system of the twenty-third preferred embodiment, the defect analysis described in the thirteenth to twenty-second preferred embodiment is automatically performed by previously storing the defect analysis method of the thirteenth to twenty-second preferred embodiments in the storing medium 32. This allows us to take early effective measures to the manufacturing processes.

While the invention has been described in detail, the foregoing description is in all aspects illustrative and not restrictive. It is understood that numerous other modifications and variations can be devised without departing from the scope of the invention.

What is claimed is:

1. A defect analysis method of a device which includes an integrated circuit formed on each of a plurality of chips on a wafer through a plurality of processes, said defect analysis method comprising the steps of:

(a) after each of at least one process out of said plurality of processes, detecting a new defect due to said at least one process and occurring in a new area of said wafer other than an area of a defect occurring at a previous process and its vicinity;

(b) after said plurality of processes are completed, making one of defective and non-defective judgement on said integrated circuit on each of said plurality of chips;

(c) judging one of a presence and absence of said new defect satisfying a predetermined identifying condition in each of said plurality of chips, for each of said at least one process;

(d) classifying said plurality of chips into four groups including non-defective chip with no said new defect, defective chip with no said new defect, non-defective chip with said new defect and defective chip with said new defect on a basis of a combination of the judgment of said step (b) and the judgment of said step (c), for each of said at least one process;

(e) calculating a number of new defective chips considered to be caused only by said new defect of said at least one process, on a basis of the classification of said step (d);

(f) calculating a critical rate of said new defect of said at least one process at which a chip is considered to become defective, on a basis of the classification of said step (d); and (g) calculating a number of process defective chips considered to be caused by said at least one process, on a basis of the classification of said step (d) and said critical rate, wherein said step (c) is performed a plurality of times for each of a plurality of detection sizes as a referred detection size, wherein said predetermined identifying condition includes a condition that a defect be of said referred detection size or more; and said steps (d) to (g) are performed said plurality of times corresponding to said step (c) which was performed said plurality of times, so that data for analysis including the number of said new defective chips, said critical rate, and the number of said process defective chips is obtained for each of said plurality of detection sizes for each of said at least one process, said defect analysis method further comprising the step of:

(h) after said steps (c) to (g) are performed said plurality of times, recognizing at least one of the following as an analysis result of said at least one process on the basis of said data for analysis:

an absolute critical detection size which is a minimum detection size for 100% of said critical rate out of said plurality of detection sizes;

the maximum number of process defective chips out of the numbers of said process defective chips obtained for said plurality of detection sizes;

an optimum-sensitivity detection size corresponding to said maximum number of process defective chips, out of said plurality of detection sizes; and the number of optimum-sensitivity new defective chips corresponding to said optimum-sensitivity detection size, out of the numbers of said new defective chips obtained for said plurality of detection sizes.

2. The defect analysis method according to claim 1, wherein said at least one process includes a predetermined number of processes which is not less than two;

said data for analysis is obtained for each of said predetermined number of processes; and said step (h) includes a step of recognizing said maximum number of said process defective chips for each of said predetermined number of processes, said defect analysis method further comprising the step of:

(i) ranking said predetermined number of processes according to their necessity for improvement, by comparing the maximum numbers of said process defective chips of said predetermined number of processes.

3. The defect analysis method according to claim 1, wherein said at least one process includes said plurality of processes;

said data for analysis is obtained for each of said plurality of processes; and said step (h) includes a step of obtaining the number of said optimum-sensitivity new defective chips for each of said plurality of processes;

said defect analysis method further comprising the step of:

(i) recognizing a degree to which the cause of defectiveness is detected, by comparing a total number of said numbers of optimum-sensitivity new defective chips of said plurality of processes, and the number of chips judged as defective at said step (b).

4. The defect analysis method according to claim 1, wherein said device includes a plurality of devices of the same structure each manufactured through said plurality of processes of a plurality of manufacturing lines;

said steps (b) to (h) are performed for each of said plurality of devices; and said step (h) includes a step of recognizing the maximum number of said process defective chips of said at least one process of each of said plurality of manufacturing lines;

said defect analysis method further comprising the step of:

(i) recognizing one of superiority and inferiority of said plurality of manufacturing lines by comparing said maximum numbers of said process defective chips of said at least one process of said plurality of manufacturing lines.

5. A defect analysis method of a device which includes an integrated circuit formed on each of a plurality of chips on a wafer through a plurality of processes, said defect analysis method comprising the steps of:

(a) after each of at least one process out of said plurality of processes, detecting a new defect due to said at least one process and occurring in a new area of said wafer other than an area of a defect occurring at a previous process and its vicinity;

(b) after said plurality of processes are completed, making one of defective and non-defective judgement on said integrated circuit of each of said plurality of chips;

(c) judging one of a presence and absence of said new defect satisfying a predetermined identifying condition in each of said plurality of chips, for each of said at least one process;

(d) classifying said plurality of chips into four groups including non-defective chip with no said new defect, defective chip with no said new defect, non-defective chip with said new defect and defective chip with said new defect on a basis of a combination of the judgment of said step (b) and the judgment of said step (c), for each of said at least one process;

(e) calculating a number of new defective chips considered to be caused only by said new defect of said at least one process, on a basis of the classification of said step (d);

(f) calculating a critical rate of said new defect of said at least one process at which a chip is considered to become defective, on a basis of the classification of said step (d); and (g) calculating a number of process defective chips considered to be caused by said at least one process, on a basis of the classification of said step (d) and said critical rate, wherein said step (c) is performed a plurality of times for each of a plurality of detection sizes as a referred detection size, wherein said predetermined identifying condition includes a condition that a defect be of said referred detection size or more; and said steps (d) to (g) are performed said plurality of times corresponding to said step (c) which was performed said plurality of times, so that data for analysis including the number of said new defective chips, said critical rate, and the number of said process defective chips is obtained for each of said plurality of detection sizes for each of said at least one process, wherein said at least one process includes a predetermined number, which is at least two, of processes which are identical in content but different in inspection apparatus to be used for inspection at said step (a);

said data for analysis is obtained for each of said predetermined number of processes; and said critical rate includes said predetermined number of critical rates of a same detection level corresponding to said predetermined number of processes, said defect analysis method further comprising the step of:

(h) recognizing a difference in sensitivity between said predetermined number of inspection apparatuses by comparing said predetermined number of critical rates of the same detection level.

6. A storage medium for storing a defect analysis program and for having a defect analysis system with a computer execute a defect analysis processing of a device which includes an integrated circuit formed on each of a plurality of chips on a wafer through a plurality of processes, said defect analysis system comprising:

at least one inspection apparatus for detecting a position of coordinates of a defect on said wafer, for determining a size of said defect after each of said plurality of processes, and for outputting defect information;

a tester for making a defective/non-defective judgement on each of said integrated circuit on said plurality of chips on said wafer after all of said plurality of processes are completed, and for outputting defective/non-defective judgment information; and a control portion for executing said defect analysis program upon receipt of said defect information and said defective/non-defective judgment information, said storage medium for storing said defect analysis program and for having said computer execute the steps of:

(a) after each of at least one process out of said plurality of processes, detecting a new defect due to said at least one process and occurring in a new area of said wafer other than an area of a defect occurring at a previous process and its vicinity, on a basis of said defect information;

(b) after said plurality of processes are completed, making a defective/non-defective judgement on said integrated circuit on each of said plurality of chips, on a basis of said defective/non-defective judgment information;

(c) judging one of a presence and absence of said new defect satisfying a predetermined identifying condition in each of said plurality of chips, for each of said at least one process;

(d) classifying said plurality of chips into four groups including non-defective chip with no said new defect, defective chip with no said new defect, non-defective chip with said new defect and defective chip with said new defect on a basis of a combination of the judgment of said step (b) and the judgment of said step (c), for each of said at least one process; and (e) calculating a number of new defective chips considered to be caused only by said new defect of said at least one process, on a basis of the classification of said step (d).

7. The storage medium according to claim 6, wherein said defect analysis program has said computer further execute the steps of:

(f) calculating a critical rate of said new defect of said at least one process, at which a chip is considered to become defective, on a basis of the classification of said step (d); and (g) calculating a number of process defective chips considered to be caused by said at least one process, on a basis of the classification of said step (d) and said critical rate.

8. A storage medium for storing a defect analysis program which has a defect analysis system with a computer for executing a defect analysis processing of a device, said device including an integrated circuit formed on each of a plurality of chips on a wafer through a plurality of processes, said defect analysis system comprising:

at least one inspection apparatus for detecting a position of coordinates of a defect on said wafer and a size of said defect after each of said plurality of processes, and for outputting defect information;

a tester for making a defective/non-defective judgement on said integrated circuit on each of said plurality of chips on said wafer after said plurality of processes are completed, and for outputting defective/non-defective judgment information; and a control portion for executing said defect analysis program upon receipt of said defect information and said defective/non-defective judgment information, wherein at least one of said control portion and said at least one inspection apparatus has a function to detect a new defect due to said at least one process, occurring in a new area of said wafer other than an area of a defect occurring at a previous process and its vicinity, after each of at least one process out of said plurality of processes on a basis of said defect information, said storage medium for storing said defect analysis program and for having said computer execute the steps of:

(a) receiving a new defect due to said at least one process;

(b) after said plurality of processes are completed, making a defective/non-defective judgement on said integrated circuit on each of said plurality of chips, on a basis of said defective/non-defective judgment information;

(c) judging one of a presence and absence of said new defect satisfying a predetermined identifying condition in each of said plurality of chips, for each of said at least one process;

(d) classifying said plurality of chips into four groups including non-defective chip with no said new defect, defective chip with no said new defect, non-defective chip with said new defect, and defective chip with said new defect on a basis of a combination of the judgment of said step (b) and the judgment of said step (c), for each of said at least one process; and (e) calculating a number of new defective chips considered to be caused only by said new defect of said at least one process, on a basis of the classification of said step (d).

9. The storage medium according to claim 8, wherein said defect analysis program has said computer further execute the steps of:

(f) calculating a critical rate of said new defect of said at least one process, at which a chip is considered to become defective, on a basis of the classification of said step (d); and (g) calculating a number of process defective chips considered to be caused by said at least one process, on a basis of the classification of said step (d) and said critical rate.

* * * * *